United States Patent [19]

Oh et al.

[11] Patent Number: 5,122,748
[45] Date of Patent: Jun. 16, 1992

[54] METHOD AND APPARATUS FOR SPATIAL LOCALIZATION OF MAGNETIC RESONANCE SIGNALS

[75] Inventors: Chang-Hyun Oh, Nanuet, N.Y.; Sadek K. Hilal, Englewood Cliffs, N.J.

[73] Assignee: The Trustees of Columbia University in the City of New York, New York, N.Y.

[21] Appl. No.: 566,671

[22] Filed: Aug. 13, 1990

[51] Int. Cl.[5] ............................................. G01R 33/20
[52] U.S. Cl. ..................................... 324/309; 324/307
[58] Field of Search ............... 324/300, 309, 307, 310, 324/311, 312, 313, 314, 318, 322; 128/653 R, 653 A, 653 SC

[56] References Cited

U.S. PATENT DOCUMENTS

| | | | |
|---|---|---|---|
| 4,651,098 | 3/1987 | Yamada et al. | 324/309 |
| 4,733,185 | 3/1988 | Bottomley | 324/309 |
| 4,766,380 | 8/1988 | Den Boef et al. | 324/309 |

OTHER PUBLICATIONS

Ordidge R. J., Connely A., and Lohman J. A. B., "Image-Selected In Vivo Spectroscopy (ISIS). A New Technique for Spatially Selective NMR Spectroscopy," *J. Mag. Res. Med.*, vol. 66, pp. 283–294, 1986.

Luyten P. R., Anderson C. M., and Hollander, J. A. D., "1H NMR Relaxation Measurements of Human Tissues In Situ by Spatially Resolved Spectroscopy," *Mag. Res. Med.*, vol. 4, pp. 431–440, 1987.

Aue W. P., Muller T. A., Cross T. A., and Seeling, J., "Volume-selective excitation. A Novel Approach to Topical NMR," *J. Mag. Res.*, vol. 56, pp. 350–354, 1984.

Doddrell, D. M., Brooks, W. M., Bulsing, J., Field, J., Irving MG, and Baddeley H., "Spatial and Chemical-Shift Encoded Excitation". SPACE, A New Technique for Volume-Selected NMR Spectroscopy, *J. Mag. Res.*, vol. 68, pp. 367–372, 1986.

Mills, P., Chew, W., Litt, A., and Moseley, M., "Localized Imaging Using Stimulated Echoes," *Mag. Res. Med.*, vol. 5, pp. 384–389, 1987.

Hu, X., Levin, D. N., Lauterbur, P. C., and Spraggins, T. A., "SLIM" Spatial Localization by Imaging, *Mag. Res. Med.*, vol. 8, pp. 314–322 1988.

Bottomley, P. A., Edelstein, W. A., Foster, T. H., and Adams, W. A., "In Vivo Solvent-Suppressed Localized Hydrogen Nuclear Magnetic Resonance Spectroscopy: A Window to Metabolism," *Proc. Natl. Acad. Sci. U.S.A.*, vol. 82, pp. 2148–2152, 1985.

(List continued on next page.)

Primary Examiner—Michael J. Tokar
Attorney, Agent, or Firm—Brumbaugh, Graves, Donohue & Raymond

[57] ABSTRACT

Spatial localization of NMR signals is obtained by applying a selective 90° RF pulse concurrently with a second order non-linear magnetic field gradient of the form $x^2+y^2-2z^2$, and then applying a selective 180° RF pulse concurrently with a linear magnetic field gradient in the z direction. The resulting spin-echo signal may be analyzed to perform volume-selected magnetic resonance spectroscopy. Spatially localized two-dimensional or three-dimensional magnetic resonance imaging may be accomplished using this spatial localization sequence together with an appropriate Fourier imaging sequence. Likewise, spatially localized one-dimensional, two-dimensional or three-dimensional chemical shift imaging may be obtained by applying one or more stepped phase encoding linear magnetic field gradients along the x, y and/or z directions. Further improvements are obtained in volume-selected magnetic resonance spectroscopy, and in spatially localized magnetic resonance imaging and chemical shift imaging by radial phase encoding using a stepped second order non-linear magnetic field gradient of the form $x^2+y^2-2z^2$ applied after any form of selective excitation of a localized region and before the sampling of the NMR data. Three-dimensional spatial localization may be achieved with the application of a single selective RF pulse by applying such an RF pulse concurrently with appropriate oscillatory or non-uniformly stepped second order non-linear and linear magnetic field gradients.

39 Claims, 9 Drawing Sheets

OTHER PUBLICATIONS

Lorrain, P. and Corson, D. R., Chapt. 10. Maxwell's Equations in "Electromagnetic Fields and Waves," W. H. Freeman and Company, San Francisco, 1970.

Pauly, J., Nishimura D., and Macovski, A., "A K-space Analysis of Small-Tip Angle Excitation," *J. Mag. Res.*, vol. 81, pp. 43–56, 1989.

Kim, Y. S., Kang, D. H., Kim, J. H., Cho, Z. H., and Ra, J. B., "Eddy Current Analysis and Its Correction Using Parameter Extraction Based on Linear Prediction,"*Proc. SMRM VII*, p. 29, 1988.

Mansfield, P. and Chapman, B., *J. Phys. E.*: vol. 19, p. 540, 1986.

Mansfield, P., Chapman, B., *J. Magn. Reson.*, vol. 66, 573, 1986.

Turner, R., Bowley, R. M., *J. Phys. E: Sci. Instrum.*, vol. 19, 876, 1986.

Mansfield, P., Chapman, B., *J. Magn. Reson.*, vol. 72, 211, 1987.

Carlson, J. W., *Proc. SMRM VII*, vol. 28, 1988.

Cho, Z. H., Kim, H. S., Oh, C. F. H., Park; H. W., and Lee S. W., "NMR Imaging: Principles, algorithms, and systems," A Chapter in Selected Topics in Image Science, Eds. O. Nalcioglu and Z. H. Cho, Springer-Verlag, Berlin, 1984.

Frahm, J., Merboldt, K., and Hanicke, W., "Localized Proton Spectroscopy Using Stimulated Echoes," *J. Magn. Reson.*, vol. 72, pp. 502–508 (1987).

Tofts, P., and Wray, S., "A Critical Assessment of Methods of Measuring Metabolite Concentrations by NMR Spectroscopy," *NMR in Biomedicine*, vol. 1, No. 1 (1988).

Oh, C. H., Hilal, S. K., Johnson, G., Mun, I. K., Gonen, O., and Cho, Z. H., "Spatial Selection Using Pulsed High–Order Magnetic Field Gradients (SHOT)," *Proc. SMRM VIII*, p. 864, Aug. 1989.

Oh, C. H., Hilal, S. K., Cho, Z. H. and Mun, I. K., "Radial Encoding Using High–Order Gradients," *SMRM*, Aug. 1990.

Lee, S. Y. and Cho, Z. H., "Localized Volume Selection Technique Using an Additional Radial Gradient Coil," *Mag. Reson. Med.*, vol. 12, pp. 56–63, Oct. 1989.

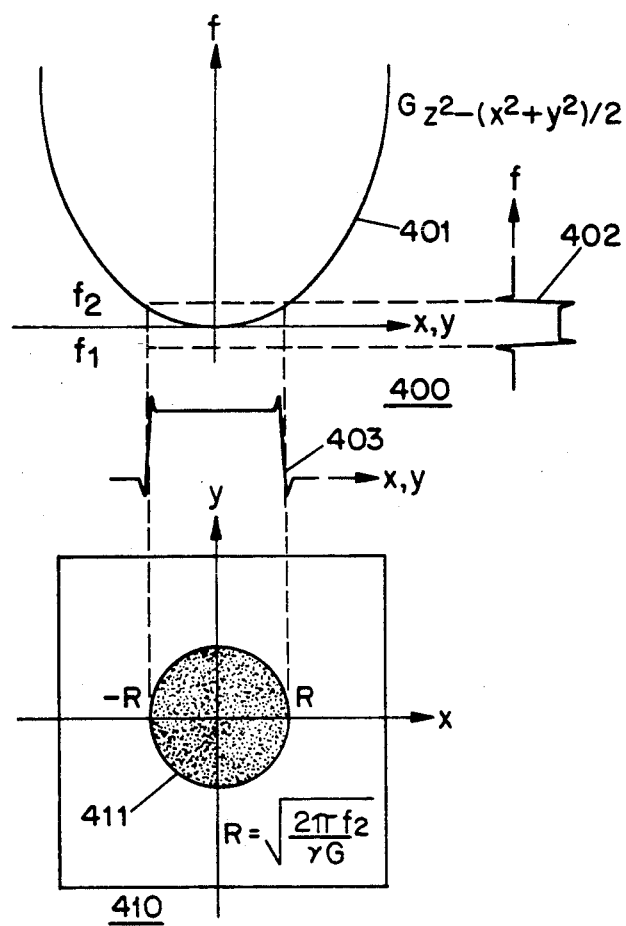
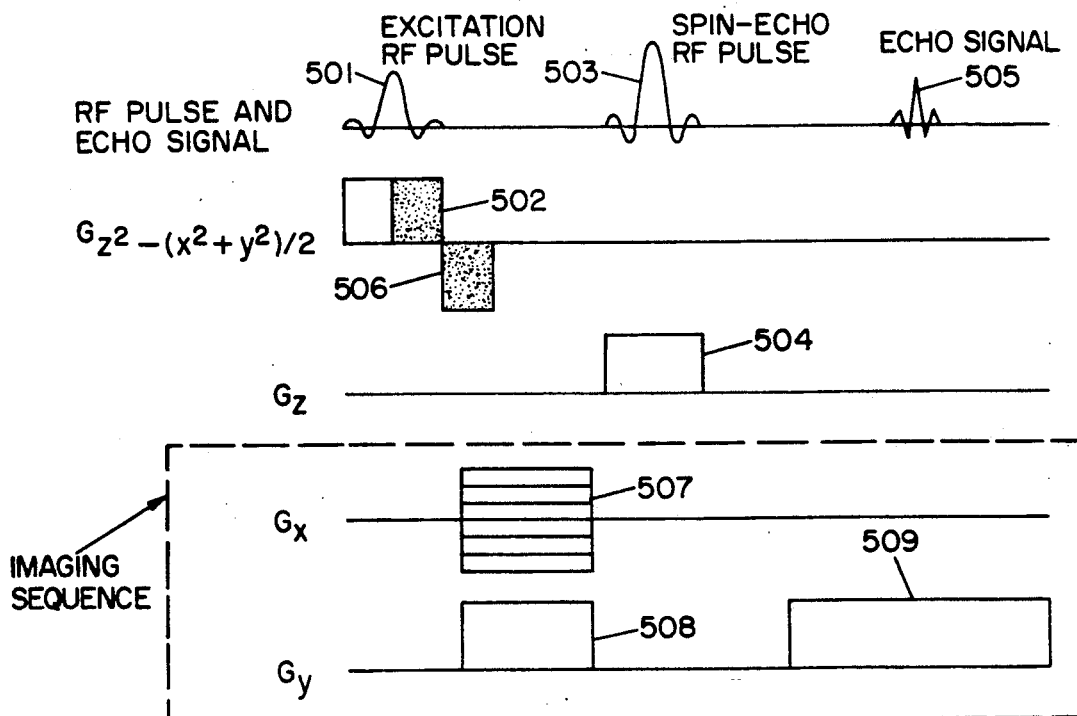
FIG. 4
FIG. 5

METHOD AND APPARATUS FOR SPATIAL LOCALIZATION OF MAGNETIC RESONANCE SIGNALS

BACKGROUND OF THE INVENTION

The present invention relates generally to nuclear magnetic resonance (NMR) and, more particularly, to spatial localization in magnetic resonance imaging (MRI), chemical shift imaging (CSI), and magnetic resonance spectroscopy (MRS) using high-order magnetic field gradients.

It is highly desirable to be able to obtain an NMR spectra or an NMR image from a selected localized region within a sample body. Where the sample body is a living organism such as a human body and the like, various in vivo studies would be possible if a localized volume can be precisely selected from the ordinarily complex three-dimensional shape of the sample object. The important criteria sought to be achieved in NMR spatial localization are: (a) good selectivity, which includes uniformity and sharp edge definition of the selected region, and good suppression of NMR signals from outside of the selected region; (b) flexibility in choosing certain parameters such as echo time, and the location and shape of the selected volume; and (c) the use of fewer radio frequency (RF) pulses for multidimensional spatial localization, which minimizes selection artifacts, reduces the minimum echo time and decreases the total RF energy applied to the sample body.

Various techniques for spatial localization of NMR signals have been proposed. The most commonly used techniques, which involve the application of combinations of selective RF pulses and linear magnetic field gradients, provide reasonably good selectivity of a localized volume in the sample body. However, these techniques all require multiple RF pulse and magnetic field gradient sequences or iterations since localization in only one dimension can be selected by each combination of an RF pulse and a linear magnetic field gradient.

A typical example of spatial localization of NMR signals using the combination of a selective RF pulse and a linear magnetic field gradient is illustrated in FIG. 1. Referring to FIG. 1, the diagram 100 depicts the selection of a linear region 101 along the x axis by applying a linear magnetic field gradient $G_x$ along the x direction concurrently with the application of an RF pulse having a frequency spectrum 102 selected to excite spins only in the linear region between $x_1$ and $x_2$. The concurrent application of the magnetic field gradient 103 and the frequency-selective RF pulse having frequency spectrum 102 produces a magnetic resonance signal (e.g., spin echo or free induction decay) distribution in the x direction represented by the curve 104.

The diagram 110 depicts the selection of a two-dimensional region 111 in the x-y plane using combinations of RF excitation pulses and linear magnetic field gradients. To select the region 111, the RF excitation pulse having frequency spectrum 102 and the linear magnetic field gradient 103 are first concurrently applied to the sample object. Thereafter, another appropriate frequency-selective RF excitation pulse (not shown) is applied concurrently with a linear magnetic field gradient in the y direction (not shown) to define the boundaries $y_1$ and $y_2$. As may be seen from the example of FIG. 1, spatial localization using linear magnetic field gradients requires a separate RF excitation pulse for a selection in each dimension. Different variations of NMR spatial localization using combinations of RF excitation pulses and linear field gradients are described, for example, in U.S. Pat. No. 4,733,185 to Bottomley; and P. Mills et al., "Localized Imaging Using Stimulated Echos," Mag. Res. Med., Vol. 5, pp. 384-389, 1987; X. Hu, "SLIM: Spatial Localization by Imaging," Mag. Res. Med., Vol. 8, pp. 314-322, 1988.

Another expedient which is commonly used in NMR spatial localization is to apply the radio frequency fields to the sample body using a surface coil, i.e., a coil located at the surface of the sample body. However, the use of a surface coil to apply the RF field to the sample body tends to provide relatively coarse resolution of the selected volume, and the sensitivity of NMR signal detection decreases rapidly away from the sample body surface.

The use of high-order magnetic field gradients for NMR spatial localization is known. U.S. Pat. No. 4,651,098 to Yamada et al. proposes high-order gradients having the following functional forms for spatial localization in NMR imaging: (1) $x^2+y^2+z^2$; (2) $h_1(x^2+y^2)+h_2z^2$, where $h_1>0$, $h_2>0$, $h_1 \neq h_2$; and (3) $h_1(x^2+y^2)+h_2z^2$, where $h_1>0$ and $h_2<0$, or $h_1<0$ and $h_2>0$. Of the three types of high-order gradients proposed by Yamada, only the one having functional form (3) can be formed in free space, without the addition of auxiliary field components, provided that $h_1=-h_2/2$. In the Yamada method, one RF excitation pulse is applied with either a high-order magnetic field gradient or a linear magnetic field gradient to select a "planar region". Thereafter, an imaging sequence of encoding and read gradients are applied followed by data sampling with no further selective RF excitation pulse being applied to the sample body. If high-order magnetic field gradients having functional forms (1) (2) could be formed in free space, a spherical or ellipsoidal volume, respectively, would be selected and could be used to generate magnetic resonance images by scanning spherical volumes or by using a linear gradient to resolve voxels along the ellipsoid. However, high-order magnetic field gradients having functional forms (1) or (2) cannot be formed in free space without the addition of auxiliary field components which would alter the shape of the selected volume from that of a sphere or an ellipsoid, respectively. Although a high-order magnetic field gradient having functional form (3) may be formed in free space, the application of an RF excitation pulse together with such a together with such a high-order magnetic field gradient selects a non-planar region of non-uniform thickness, which is not useful for volume-selective MRS, MRI or CSI purposes without a further complex selection procedure. The functional form (3) with $h_1=-h_2/2$ can be expressed as $z^2-(x^2+y^2)/2$. A high-order magnetic field gradient of such functional form is uniform in the $z=0$ plane, but becomes increasingly non-uniform as z increases or decreases from the value 0.

More recently, another NMR spatial localization technique using a radial gradient is described in S. Y. Lee et al., "Localized Volume Selection Technique Using an Additional Radial Gradient Coil", Mag. Res. Med., Vol. 12, pp. 56-63, Oct. 1985. According to the Lee technique, a circular region is selected by applying a radial magnetic field gradient in the x-y plane in conjunction with an RF excitation pulse. The radial magnetic field gradient is generated using a one loop main coil located in the $z=0$ plane in combination with a pair of Helmholtz coils which are used to cancel non-zero fields at the center of the main coil. Since a single-loop coil located in the z=0 plane generates many auxiliary field components, including a $z^4$ component, in addition to a second order gradient component, it is extremely difficult using the Lee technique to move, or modify the shape or orientation of the selected volume.

Accordingly, a need clearly exists for an NMR spatial localization technique which overcomes the foregoing deficiencies of the prior art in providing: (i) improved uniformity and edge definition of the selected volume, and improved suppression of magnetic resonance signals from outside of the selected volume; (ii) improved flexibility in choosing the selection parameters, including the location, direction and shape of the selected volume; (iii) multidimensional selection using fewer RF pulses to achieve volume selection in a shorter time with minimal selection artifacts and with lower total RF energy being applied to the sample body; and (iv) improved simplicity in generating "zoomed" images without having to perform high-resolution imaging on the entire sample body.

SUMMARY OF THE INVENTION

The deficiencies of the prior art, as discussed above, are substantially removed by the present invention which in one aspect is a method for spatially localizing NMR signals in a sample body. A frequency-selective excitation RF pulse and a second order non-linear magnetic field gradient are first concurrently applied to the sample body situated in a homogeneous static magnetic field in the z direction. Thereafter, a frequency-selective spin-echo RF pulse is applied to the sample body concurrently with a linear selection magnetic field gradient pulse in the z direction. The foregoing procedure produces a spin-echo signal from a localized volume in the sample body defined by the concurrent application of the selective excitation RF pulse and the non-linear magnetic field gradient pulse, and the subsequent concurrent application of the selective spin-echo RF pulse and the linear magnetic field gradient pulse in the z direction.

Magnetic resonance imaging may be achieved using the above-described spatial localization technique together with a stepped phase encoding linear magnetic field gradient in the x direction and a dephasing linear magnetic field gradient in the y direction applied before sampling of the spin-echo signals, and a read linear magnetic field gradient applied during sampling of the spin-echo signal. By performing Fourier transform analysis on the sampled spin-echo signals, a two-dimensional magnetic resonance image of the localized volume of the sample body is obtained. A three-dimensional magnetic resonance image of the localized volume may be obtained by also applying a stepped phase encoding linear magnetic field gradient in the z direction before sampling of the spin-echo signals.

Likewise, volume-selected magnetic resonance spectroscopy and chemical shift imaging may be achieved by applying a stepped phase encoding linear magnetic field gradient in the x, y and/or z directions before sampling of the spin-echo signals, and performing Fourier transform analysis on the sampled spin-echo signals.

In an exemplary embodiment of the invention, the second-order non-linear magnetic field gradient has the functional form $z^2-(x^2+y^2)/2$. To allow for positioning or rotation of the selected volume or modification of the shape of the two-dimensional selection, the second order non-linear gradient pulse may be a linear combination of one or more of the second-order gradient terms, $x^2+y^2-2z^2$, $x^2-y^2$, $xy$, $yz$ and $zx$, and lower-order items $x$, $y$, $z$ and $z^0$. In addition, the linear selection magnetic field gradient may be a linear combination of one or more first-order gradient components $x$, $y$ and $z$ to allow rotation of the selected plane.

In another aspect of the present invention, there is provided a method for encoding in the radial direction using second order non-linear magnetic field gradients. Such radial phase encoding can be used in conjunction with the above-described spatial localization technique by also applying a stepped second order non-linear magnetic field gradient before sampling of the spin-echo signals. Alternatively, a stepped second order non-linear magnetic field gradient may be applied after any form of selective excitation of a localized region using linear and/or non-linear magnetic field gradients to produce radially phase encoded FID signals.

Still another aspect of the present invention is a method for spatially localizing NMR signals from a sample body by first applying a homogeneous static magnetic field to the sample body along the z direction and then concurrently applying to the sample body a frequency-selective excitation RF pulse, an oscillatory second order non-linear magnetic field gradient and an oscillatory linear magnetic field gradient, where the respective waveforms of the excitation RF pulse, the oscillatory non-linear magnetic field gradient and the oscillatory linear magnetic field gradient are selected to provide selective excitation of a localized volume in the sample body. In this manner three-dimensional volume selection in the sample body is achieved using only a single RF pulse. After selective excitation in the foregoing manner, stepped phase encoding linear magnetic field gradients may be successively applied to produce phase encoded FID signals for volume-selected magnetic resonance spectroscopy or chemical shift imaging.

Yet another aspect of the present invention is an apparatus for obtaining NMR data from a localized volume in the sample body by carrying out the above-described method. In an exemplary embodiment, the apparatus includes a coil structure having a primary winding arrangement for applying second order non-linear magnetic field gradients to the sample body, and a shield winding arrangement for minimizing eddy currents induced in the conductor portions of the main magnet when the non-linear magnetic field gradients are pulsed.

BRIEF DESCRIPTION OF THE DRAWINGS

The present invention may be better understood with reference to the following detailed description of exemplary embodiments, taken in conjunction with the accompanying drawings, in which:

FIG. 4 are diagrams illustrating the selection of a two-dimensional region by the concurrent application of a frequency-selective excitation RF pulse and a second order non-linear magnetic field gradient having the functional form $z^2-(x^2+y^2)/2$ in accordance with the present invention;

FIG. 5 diagrammatically depicts the sequence of RF pulses and magnetic field gradients for volume-selected Fourier transform magnetic resonance imaging in accordance with the invention;

Throughout the figures of the drawings, the same reference numerals or characters are used to denote like features, components or structural parts of the illustrated method and apparatus.

DETAILED DESCRIPTION

Figure 2:
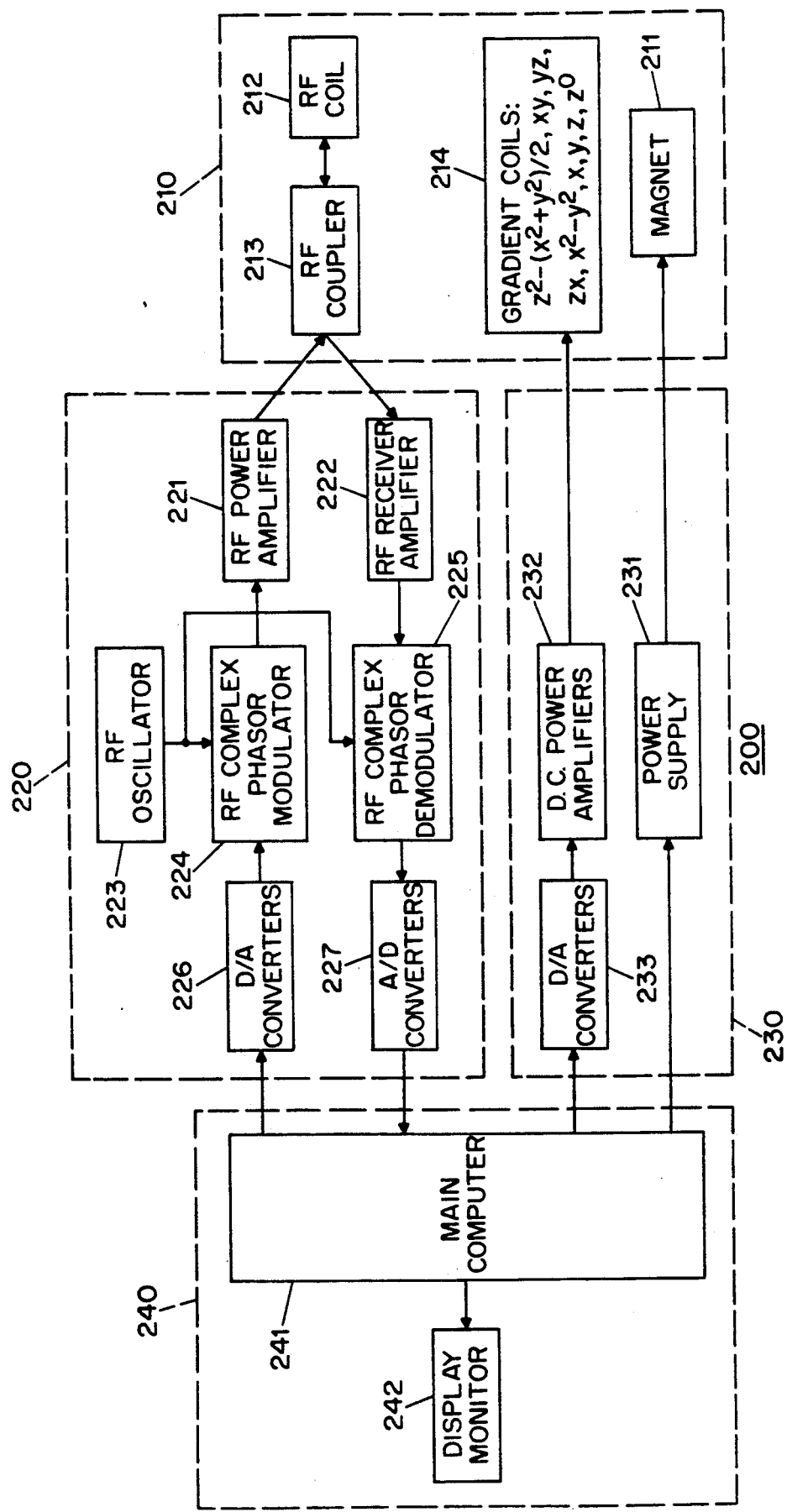
FIG. 2 is a block diagram of a system for obtaining and analyzing NMR data for spectroscopy and imaging in accordance with the invention.

Referring to FIG. 2, there is shown a block diagram 200 of a system for obtaining and analyzing NMR data for spectroscopy and imaging in accordance with the invention. The system 200 includes an RF and magnet section 210 having a magnet 211 for applying a static uniform magnetic field in the z direction to a sample body (not shown in FIG. 2), gradient coils 214 for applying second order non-linear and linear magnetic field gradients to the sample body, and an RF coil 212 for applying RF pulses to the sample body and for receiving NMR signals from the sample body.

The system 200 also includes a control section 240 having a main computer 241 which is coupled to a display monitor 242. The main computer 241 generates signals defining magnetic field gradient pulse waveforms which are provided to the D/A converters 233 of a magnetic field and gradient driver section 230. The output of the D/A converters 233 are provided to dc power amplifiers 232 which drive the gradient coils 214. The main computer 241 also provides a control signal for the power supply 231 of section 230 which supplies current to the magnet 211. RF pulse waveform signals are also generated by the main computer 241 and provided to D/A converters 226 of a transmitter and receiver section 220. The outputs of the D/A converters, which are the real and imaginary parts of RF pulse waveforms, are provided to an RF complex phasor modulator 224 where each part is modulated by an RF signal from an RF oscillator 223 and combined before being provided to an RF power amplifier 221. The output of the RF power amplifier 221 is provided through the RF coupler 213 to the RF coil 212.

The RF coupler 213 serves the dual purpose of coupling RF pulses from the RF power amplifier 221 to the RF coil 212 and for coupling NMR signals (FID or spin-echo signals) detected from the sample body by the RF coil 212 to an RF receiver amplifier 222. The output of the RF receiver amplifier 222 is provided to an RF complex phasor demodulator 225 which demodulates the NMR signals into real and imaginary parts and provides the demodulated signal components to A/D converters 227. The demodulated NMR signals which are converted to digital form by the A/D converters 227 are provided to the main computer 241 for processing to achieve volume-selected magnetic resonance spectroscopy or magnetic resonance imaging.

Figure 1:
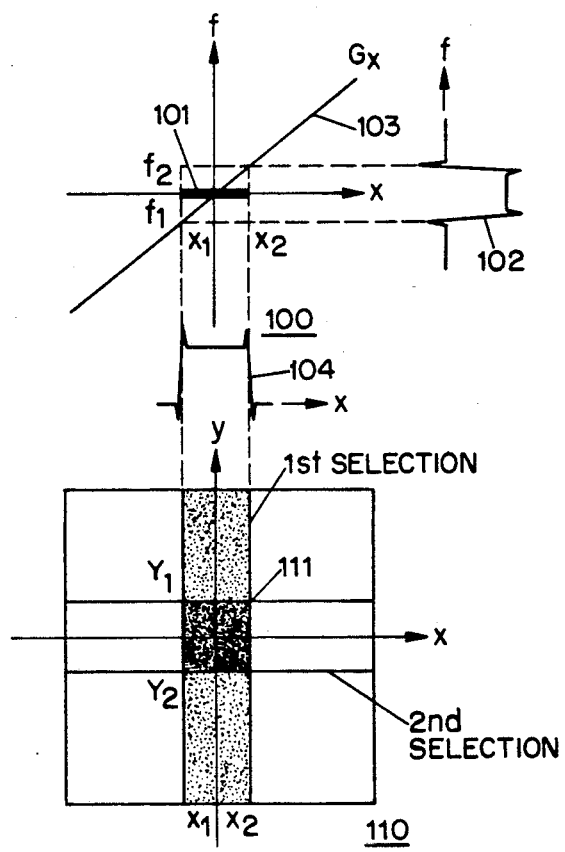
FIG. 1 are diagrams illustrating the selection of one dimensional and two dimensional regions using linear magnetic field gradients and frequency-selective RF pulses in accordance with the prior art.
Figure 3:
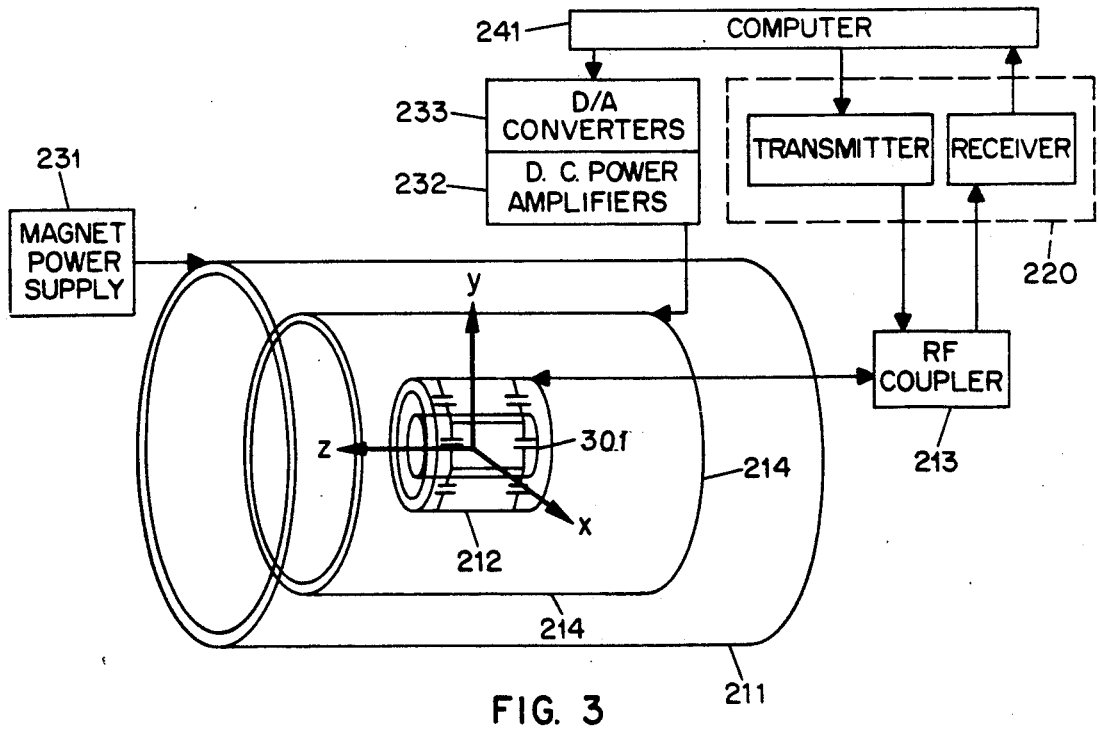
FIG. 3 is a partial schematic and partial block diagram illustrating in greater detail the magnet, the gradient coils and the RF coil of the system of FIG. 2.

Turning to FIG. 3, there is shown a schematic diagram illustrating the arrangement of various components for generating the static magnetic field, the magnetic field gradients and the RF pulses used to produce the NMR signals and to detect such signals in the system of FIG. 2. The magnet 211 for producing a uniform static magnetic field along the z direction is a circular cylindric solenoid coaxial with the z axis energized by a current provided by the magnet power supply 231. The gradient coils 214 for producing second order non-linear magnetic field gradients and linear gradients are shown schematically as being situated within the coils of the magnet 211. The design of the coils for generating second order non-linear magnetic field gradients in accordance with an exemplary embodiment of the invention is described below. Conventional designs are used for the coils for generating the linear magnetic field gradients in the x, y and z directions. The RF coils 212 are shown schematically as being situated within the gradient coils 214 and are of conventional design. The sample body 301 is situated within the RF coil 212.

It is noted that the air core solenoid magnet 211 may be replaced by various other means for producing a homogeneous static magnetic field, such as an electromagnet, a super conducting magnet or a permanent magnet, and the single RF coil 212 may be replaced by two separate coils, one for applying the RF pulses and the other for detecting the NMR signals.

Spatial Localization with Second Order Non-Linear Magnetic Field Gradients

In accordance with the invention, a localized volume of the sample body is selected by first applying a frequency-selective excitation RF pulse concurrently with a high order magnetic field gradient to achieve a two-dimensional selection. Subsequently, a spin-echo RF pulse is applied concurrently with a linear magnetic field gradient for localization in the third direction. Of the higher order fields which can be formed in free space, i.e., fields which are solutions to the Laplace equation, the second order fields are found to have several useful advantages over higher order fields for purposes of providing non-linear magnetic field gradients for spatial localization of NMR signals. A second order field is one which has the functional form (i.e., directly proportional to) of a second order polynomial. These advantages include easier selection of a localized region owing to simpler field patterns, easier shifting of the position of the localized volume by applying first order and 0th order terms, and fewer auxiliary terms to deal with than in higher order fields.

Among the various second order magnetic field gradients, the one having the functional form $z^2 - (x^2 + y^2)/2$ (referred to as the "$z^2$ gradient") is particularly advantageous as the basic field pattern used in spatial localization in accordance with the invention, since shifting, rotation and modification of the shape of the selected volume may be obtained by combining other second order terms.

If the center of the $z^2 - (x^2 + y^2)/2$ is to be shifted from $z = 0$ to $z = z_0$ such shifting can easily be achieved by applying a shifting field, $B'$, having the form of a combination of a linear gradient in the z direction and a constant offset, i.e., $B' = (-2z_0)z + z_0^2$. It is noted that the constant field offset $z_0^2$ can be substituted by an RF frequency offset of $\gamma z_0^2$, where $\gamma$ is the gyromagnetic ratio of the spins of interest. Shifting of the selected volume in the x or y directions may be achieved in a similar manner, i.e., by the addition of a shifting field consisting of a combination of a linear field gradient in the x or y direction and a constant offset field proportional to the square of the distance shifted in the x or y direction.

The shape of the selected volume may be modified by applying a field gradient which is an appropriate linear combination of the $z^2 - (x^2 + y^2)/2$ component and the $x^2 - y^2$ component to obtain a field pattern having the functional form $z^2 - ax^2 - by^2$. Such a field pattern can be used to select an elliptical plane at $z = 0$ with an arbitrary eccentricity.

Rotation of the selected volume may be achieved by using a field having the functional form $x^2 - (y^2 + z^2)/2$ or $y^2 - (x^2 + z^2)/2$ obtained by a linear combination of the $z^2 - (x^2 + y^2)/2$ component and the $x^2 - y^2$ component. By using a non-linear magnetic field gradient having one or the other functional forms one may select an arbitrarily shaped planar region in the x or y direction. If the linear combination of components includes the xy, yz and zx components, rotation of the selected volume may be obtained about any arbitrary axis in a three-dimensional space.

Referring to FIG. 4, there is shown an example of a two-dimensional selection obtained by concurrently applying a frequency-selective excitation RF pulse and a second order non-linear magnetic field gradient having the functional form $z^2 - (x^2 + y^2)/2$. Diagram 400 depicts the $z^2$ gradient 401 and the frequency spectrum 402 of an excitation RF pulse having frequencies between $f_1$ and $f_2$. The concurrent application of the excitation RF pulse having frequency spectrum 402 and the non-linear magnetic field gradient 401 results in a magnetic resonance signal intensity distribution in the x-y plane represented by the curve 403. In diagram 410, the distribution of magnetic resonance signal intensity produced by the concurrent application of the excitation RF pulse having frequency spectrum 402 and the second order non-linear magnetic field gradient 401 is represented by a circular region 411 in the x-y plane having a radius R, where $R = \sqrt{2\pi f_2/(\gamma G)}$.

Application to Magnetic Resonance Imaging

Turning to FIG. 5, there are shown the sequence of RF pulses and magnetic field gradients used for magnetic resonance imaging according to an exemplary embodiment of the present invention. A three-dimensional volume selection is obtained in two steps. First, a frequency selective excitation RF pulse 501 is applied concurrently with a second order non-linear magnetic field gradient 502 having the functional form $z^2 - (x^2 + y^2)/2$ to achieve a two-dimensional selection, as illustrated in the example of FIG. 4. Subsequently, a spin-echo RF pulse 503 is applied concurrently with a linear magnetic field gradient in the z direction 504 for localization in the third dimension. The excitation RF pulse 501 selects a circle in the x-y plane, and the narrow-band spin-echo RF pulse selectively refocuses a slice in the z-direction thereby completing a volume selection.

It may be noted that the same three-dimensional volume selection may be obtained by first applying the excitation RF pulse concurrently with the linear selection magnetic field gradient before the concurrent application of the spin-echo RF pulse with the second order non-linear magnetic field gradient. In either case, a spin-echo signal is obtained.

The use of an excitation RF pulse 501 having a full truncated sinc shape in the present example results in a very widely spread distribution of the phases of the excited spins caused by a dephasing effect during excitation. The dephasing is corrected by the application of a rephasing gradient pulse 506 which refocuses the spins which are dephased during excitation. The rephasing gradient pulse 506, which is also a $z^2$ gradient, has a polarity opposite to that of the selection gradient pulse 502 and an integrated area (indicated by shading) which is equal to the integrated area of the portion of the selection gradient pulse 502 which overlaps half the integrated area of the excitation RF pulse 501 (indicated by the shaded portion of the gradient 502).

In order to generate spin-echo signals 505 which can be used by the main computer 241 for the reconstruction of an image of a selected region of the sample body, a sequence of magnetic field gradients required for magnetic resonance imaging is applied to the sample body in addition to the above-described spatial localization sequence. Although any magnetic resonance imaging sequence may be used with a spatial localization sequence in accordance with the present invention, the example of FIG. 5 uses the conventional Fourier imaging sequence. For two-dimensional imaging, a phase encoding linear gradient 507 along the x direction having a gradient strength which changes by a regular interval from a negative polarity to a positive polarity each time it is repeated (i.e., "stepped") is respectively applied along with a constant dephasing linear gradient 508 after the excitation sequence before the sampling of the spin-echo signal 505, and a readout linear magnetic field gradient 509 is applied during the sampling of the spin-echo signal 505. It is noted that the phase encoding magnetic field gradient 507 may be along the y direction, in which case the dephasing magnetic field gradient 508 and the readout magnetic field gradient 509 are in the x direction. To achieve three-dimensional Fourier transform imaging there must also be applied a stepped phase encoding linear magnetic field gradient in the z direction, in addition to the imaging sequence shown in FIG. 5.

Application to Magnetic Resonance Spectroscopy and Chemical Shift Imaging

Figure 6:
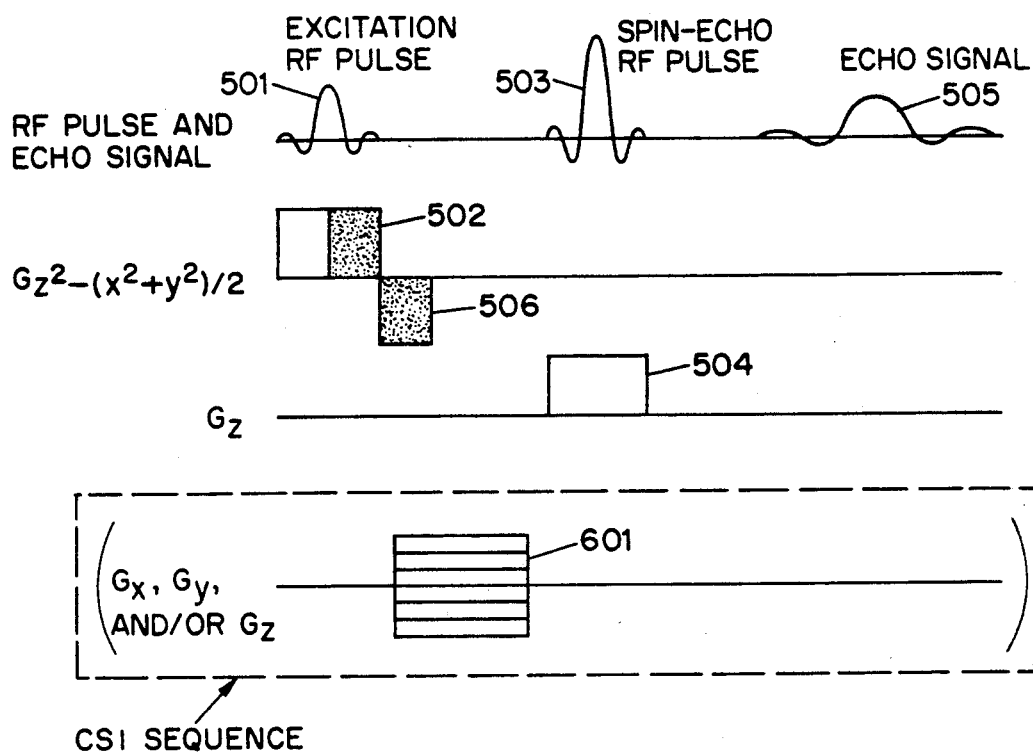
FIG. 6 diagrammatically depicts the sequence of RF pulses and magnetic field gradients for volume-selected magnetic resonance spectroscopy or chemical shift imaging in accordance with the invention.

Turning now to FIG. 6, there is shown a sequence of RF pulses and magnetic field gradient pulses for achieving spatially localized magnetic resonance spectroscopy or chemical shift imaging in accordance with another exemplary embodiment of the invention. Three-dimensional spatial localization is again achieved by first applying to the sample body a frequency-selective excitation RF pulse 501 concurrently with a $z^2$ gradient 502, and the subsequent application to the sample body of a frequency-selective spin-echo RF pulse 503 concurrently with a selecting linear magnetic field gradient 504. Such spatial localization produces a spin-echo signal 505. A rephasing $z^2$ gradient 506 is applied to refocus spins which are dephased during excitation. To achieve spatially localized magnetic resonance spectroscopy or chemical shift imaging in one, two or three-dimensions, stepped phase encoding linear gradients 601 in one, two or all three of the x, y and z directions, respectively, are applied at any time before sampling of the spin-echo signal 505. It is noted that for spatially localized magnetic resonance spectroscopy or chemical shift imaging, neither a dephasing gradient nor a readout gradient is necessary.

Three Dimensional Spatial Localization Using One RF Pulse

Figure 7:
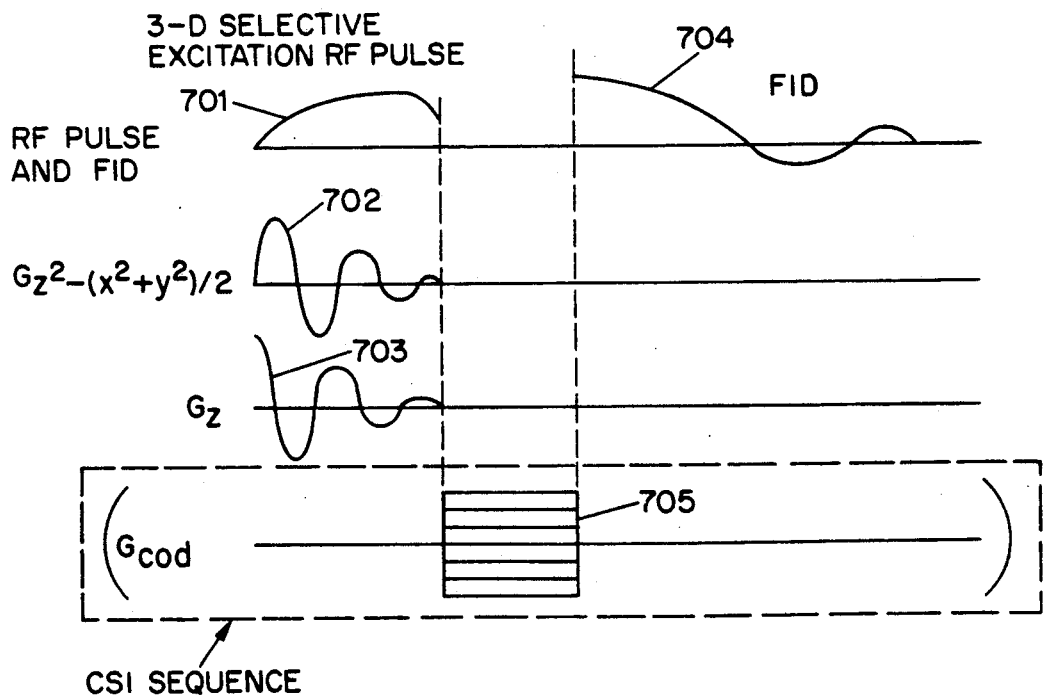
FIG. 7 diagrammatically depicts the sequence of RF pulses and magnetic field gradients for volume-selected magnetic resonance spectroscopy and chemical shift imaging using a single selective RF pulse and oscillating non-linear and linear magnetic field gradients in accordance with the invention.

Turning to FIG. 7, there is shown a sequence of an RF pulse and magnetic field gradients for achieving magnetic resonance spectroscopy or chemical shift imaging in accordance with still another exemplary embodiment of the invention. Here three-dimensional spatial localization is achieved by concurrently applying to the sample body a single excitation RF pulse 701, an oscillatory $z^2$ magnetic field gradient 702 and an oscillatory linear magnetic field gradient in the z direction 703. The respective waveforms of the excitation RF pulse 701 and the oscillatory magnetic field gradient 702 and 703 are such that a particular localized volume in the sample body is selected to provide an FID signal 704 from the localized volume. Chemical shift imaging in one, two or three-dimensions is achieved by the application of a uniformly stepped phase encoding linear magnetic field gradient 705 in one, two or all three of the x, y and z directions respectively. It is noted that the phase encoding linear gradient 705 is not required for spatially localized magnetic resonance spectroscopy.

The waveforms for the excitation RF pulse 701 and the non-linear and linear magnetic field gradient 702 and 703 are now calculated. The concept of scanning spatial frequency or k-space, is used for representing spatially selective RF excitation of spins distributed in two dimensions. Although the excitation RF pulse actually selects a volume in three dimensions, a two-dimensional k-space having components $k_z$ and $k_{x2+y2-2z2}$ is sufficient for the representation, since only two magnetic field gradients $G_z$ and $G_{x2+y2-2z2}$ are being applied. The excitation may therefore be represented as the scanning of the applied RF energy across the k-space. This representation is only strictly valid for small tip-angles, but holds well for angles on the order of 90°. The trajectory of the scan of k-space is first taken as a single, tightly looped, constant-angular-rate spiral scan. A spatial frequency k(t) scanned by a gradient G(t) is defined as $$k(t) = \gamma \int_t^T G(s)ds, \quad (1)$$

where $\gamma$ is the gyromagnetic ratio, T is the duration of the RF pulse and the magnetic field gradients, and the bold characters each represent a two-dimensional vector.

The k-space trajectory in the form of a constant-angular-rate spiral can be expressed as $$k_z(t) = (\pi/D_z)(1 - t/T)\cos(2\pi nt/T + \theta) \quad (2)$$

and $$k_{r2}(t) = (\pi/D_{r2})(1 - t/T)\sin(2\pi nt/T + \theta), \quad (3)$$

where $r^2$ equals $x^2+y^2-2z^2$, n is the number of cycles of the spiral which is taken to be equal to half the ratio of the sample coverage to the necessary resolution ($D_z$ and $D_{r2}$ are the necessary resolutions in the z and the $x^2+y^2-2z^2$ domains, respectively), and $\theta$ is the starting angle of the spiral scan in the k-space which is equal to 0 in the present case (no interlacing single scan). The gradient waveforms which produce this k-space trajectory is expressed as $G(t)=(1/\gamma)k'(t)$, where $k'(t)$ is the time derivative of k(t). Therefore, the two components of G(t) are $$G_z(t) = -\{\pi/(D_z\gamma T)\}[2\pi n(1-t/T)\sin(2\pi nt/T+\theta) + \cos(2\pi nt/T+\theta)] \quad (4)$$

and $$G_{r2}(t) = \{\pi/(D_{r2}\gamma T)\}[2\pi n(1-t/T)\cos(2\pi nt/T+\theta) - \sin(2\pi nt/T+\theta)]. \quad (5)$$

The k-space weighting function is given by the Fourier transform of the spatial localization function. For the domain defined by the gradients $x^2+y^2-2z^2$ and z, the k-space weighting function, W(k) is expressed as a product of two sinc functions $$W(k) = \alpha\,\text{sinc}[k_z W_z/(2\pi)]\,\text{sinc}[k_{r2}W_{r2}/(2\pi)], \quad (6)$$

where sinc (x) is defined as
sinc (x) = 1, if x = 0 and
sinc (x) = sin($\pi$x)/($\pi$x), otherwise, $W_z$ and $W_{r2}$ are the selection widths in the z and $x^2+y^2-2z^2$ domains, respectively, and $\alpha$ scales the spin-flip angle.

For the single, constant-angular-rate spiral trajectory in k-space, the RF pulse waveform, $B_1(t)$, may be expressed as $$B_1(t) = W(k(t))|\gamma G(t)| = \quad (7)$$

-continued $$a'\text{sinc}\left(\frac{W_z}{2D_z}\left(1-\frac{t}{T}\right)\cos(2\pi nt/T + \theta)\right).$$

$$\text{sinc}\left(\frac{W_{r2}}{2D_{r2}}\left(1-\frac{t}{T}\right)\sin(2\pi nt/T + \theta)\right).$$

$$\sqrt{[2\pi n(1 - t/T)]^2 + 1} \ ,$$

where $\alpha'$ scales the spin flip angle and the absolute value was taken from the gradients normalized by their respective maximum values.

The duration of the RF pulse 701 and the magnetic field gradient 702 and 703 must be kept relatively short in order to avoid distortions in spatial selection caused by inhomogeneities in the main magnetic field and by chemical shift. However, reducing the durations of the RF pulse and the magnetic gradients also reduces the resolution of the constant-angular-rate spiral scanning of k-space. An alternative k-space scanning trajectory is to interlace multiple constant-angular-rate spiral scanning with each scan having fewer cycles. By reducing the number of cycles in each of the interlaced constant-angular-rate spiral scan, the durations of the RF pulse and the magnetic field gradients are also reduced, thereby reducing the distortions caused by field inhomogeneities and chemical shift. The resulting lower resolution of the scanning of k-space with spiral trajectories having fewer cycles is recovered by making multiple scans with different starting angles $\theta$ (i.e., interlaced scanning). The NMR data acquired during each of the multiple scans are then added to obtain NMR data having the desired resolution. The waveforms of the RF pulse and of the non-linear and linear magnetic fields during each of the multiple scans may be calculated using Eqs. (4), (5) and (7).

A further alternative trajectory for scanning the k-space which would permit the use of shorter duration RF pulse and magnetic field gradients is to use multiple radial scanned trajectories. The use of such scan trajectories provides for the application of constant magnetic field gradients (i.e., n=0 in Eqs. (2)-(5)) with many different combinations of the two gradients applied with a time varying RF pulse. The two gradient intensities are expressed as $$G_z(t) = -(\pi/D_z \gamma T)\cos(\theta_l) \quad (8)$$

and $$G_{r2}(t) = (\pi/D_{r2}\gamma T)\sin(\theta_l) \quad (9)$$

where $\theta_l = 2\pi l/L$ for $l=1,2,3,\ldots,L$. The quantity L determines the resolution of the k-space scanning and is chosen as an integer approximately equal to $2\pi n$.

Figure 8:
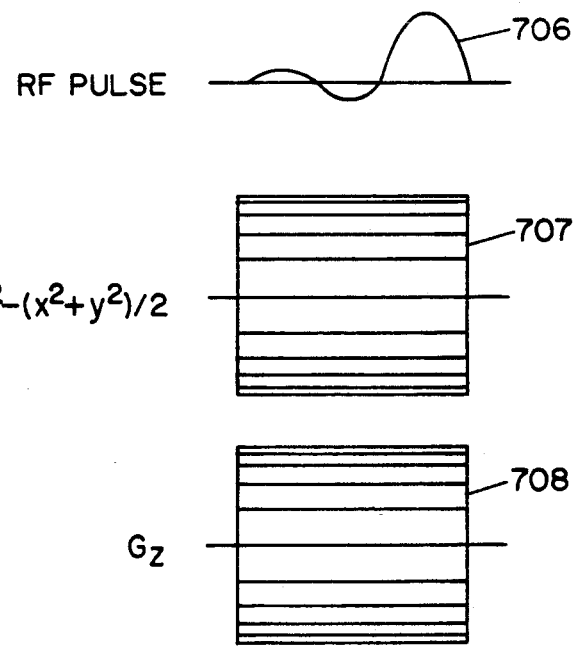
FIG. 8 diagrammatically illustrates an RF pulse waveform and non-uniformly stepped non-linear and linear magnetic field gradients which are concurrently applied to obtain three-dimensional spatial localization in accordance with the invention.

The RF waveform, $B_1(t)$, for the radial scanning case is again expressed as Eq. (7) with n=0 and $\theta=\theta_l$. The NMR data obtained from multiple application of the foregoing RF pulse and magnetic field gradients are added to obtain the full resolution spatially localized NMR data. An exemplary waveform for the RF pulse and the intensities of the non-linear and linear magnetic field gradients are shown in FIG. 8. It is noted in FIG. 8 that the intensities of the non-linear and linear magnetic field gradients are non-uniformly stepped in that the intensity of each gradient is changed by a non-uniform amount in each repetition in going from negative polarity to a positive polarity.

Repetitive radial scanning of the k-space permits the duration of the RF pulse and the magnetic field gradients to be minimized. Since the magnetic field gradients do not oscillate (i.e., remain constant with time) lower gradient intensities are required, and for the same gradient intensities, the RF pulse length may be reduced to permit the acquisition of data from shorter T2 components and with less distortion caused by magnetic field inhomogeneities and chemical shift. It should be noted that the localization shape can be altered by redefining W(k) as a Fourier transform of any arbitrarily selected localization function.

Radial Encoding

In addition to spatial localization, the high-order gradients can be used for phase encoding in a radial direction. A volume in the radial direction may be resolved by Fourier transform analysis of FID or spin-echo data obtained after successive application of stepped high-order phase encoding gradients. Radial phase encoding can provide several advantages when used in conjunction with the above-described spatial localization techniques using selective RF pulses. Since the selection size using selective RF pulses is limited by the strength of the non-linear field gradient, the use of radial phase encoding can provide a reduction in the minimum selection size, which is determined by the duration of the encoding gradient. When a circular region is selected by using a high-order magnetic field gradient and a frequency-selective RF pulse, as illustrated in FIG. 4, errors may be introduced in the radius of the selected region by chemical shift and/or inhomogeneities in the main magnetic field. However, a region selected by radial phase encoding using a high-order magnetic field gradient is not effected by chemical shift. Furthermore, the size of a region selected by radial phase encoding may be changed during Fourier transform processing. For example, the magnetic resonance spectra from several different selected regions may be combined to provide a spectrum for an arbitrary region selected during processing.

Figure 9:
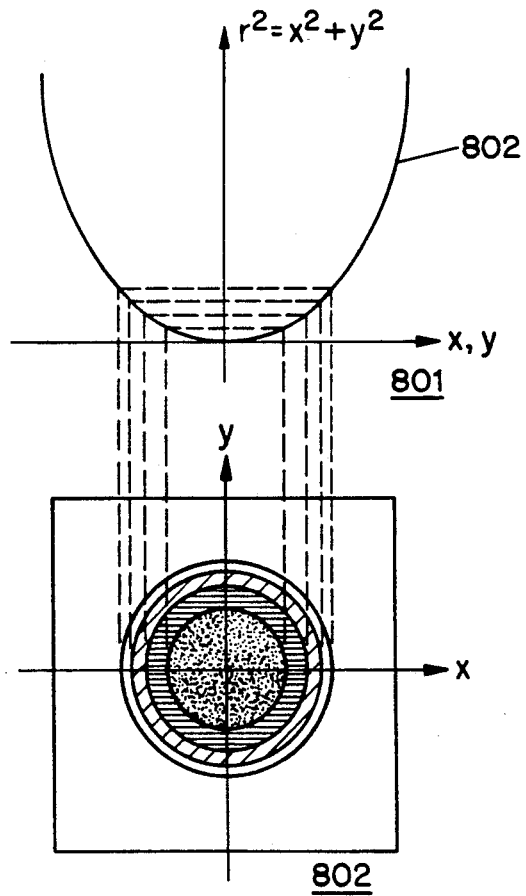
FIG. 9 are diagrams illustrating the resolution of a radially phase-encoded volume by three-dimensional Fourier transform analysis in accordance with the invention.

The resolution of a selected volume by radial phase encoding is illustrated in FIG. 9. By constructing two dimensional images from the three-dimensional Fourier transformed radially encoded NMR data, as represented by the curve 802 in diagram 801, rings of increasing radius and decreasing radial thickness in the x-y plane are obtained, as illustrated in diagram 802. Therefore, radial phase encoding using a high order gradient is especially useful for volume-selected magnetic resonance spectroscopy, where the selected volume has a small diameter.

Figure 10:
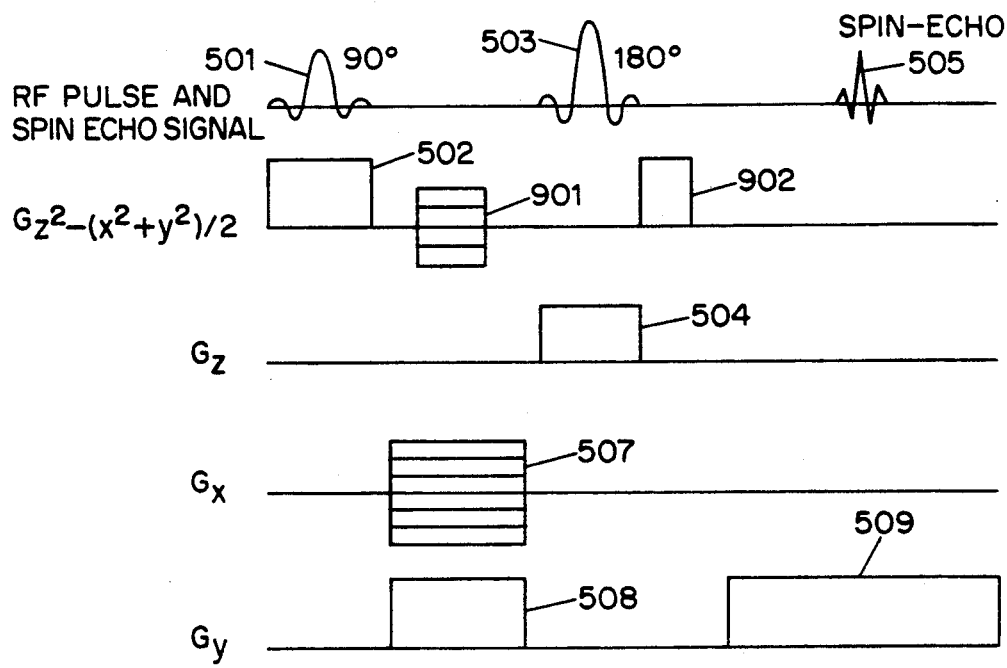
FIG. 10 diagrammatically illustrates the sequence of RF pulses and magnetic field gradients for volume-selected Fourier transform magnetic resonance imaging, including the use of radial phase encoding in accordance with the invention.

Referring now to FIG. 10, there is shown the sequence of RF pulses and magnetic field gradients for magnetic resonance imaging according to yet another exemplary embodiment of the invention. The sequence of RF pulses and magnetic field gradients shown in FIG. 10 are identical to those shown in FIG. 5, except for the addition of a stepped radial phase encoding magnetic field gradient 901 and the replacement of the rephasing gradient 506 in FIG. 5 by an equivalent rephasing gradient 902 in FIG. 10. Both the radial phase encoding gradients 901 and the rephasing gradient 902 have the functional form $z^2 - (x^2 + y^2)/2$.

Figure 11:
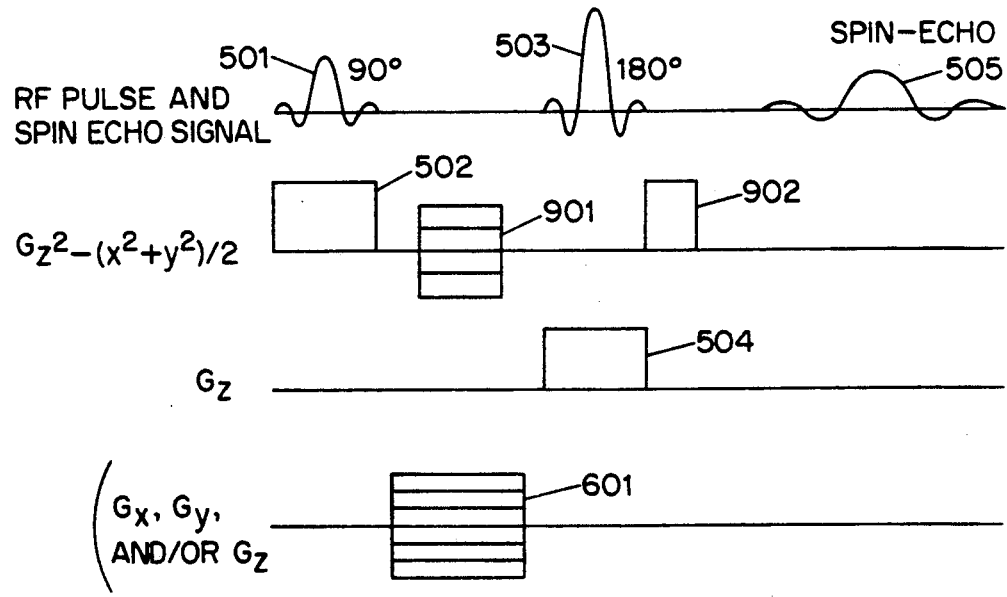
FIG. 11 diagrammatically illustrates the sequence of RF pulses and magnetic field gradients for magnetic resonance spectroscopy or chemical shift imaging, including the use of radial phase encoding, in accordance with the invention.

In FIG. 11 there is shown the sequence of RF pulses and magnetic field gradients for spatially localized magnetic resonance spectroscopy and chemical shift imaging in accordance with a further exemplary embodiment of the invention. The RF pulses and magnetic field gradients shown in FIG. 11 are identical to those shown in FIG. 6, except for the addition of the stepped radial phase encoding gradient 901 and the replacement of the rephasing gradient 506 in FIG. 6 with the equivalent rephasing gradient 902 in FIG. 11. Here again, the radial phase encoding magnetic field gradient 901 and the rephasing gradient 902 have the functional form $z^2-(x^2+y^2)/2$. The analysis of radially phase encoded spin-echo data for magnetic resonance imaging or spatially resolved magnetic resonance spectroscopy is discussed below.

It should be noted that the techniques for position shift, rotation and shape modification of second order non-linear magnetic field gradients can also be advantageously applied to radial phase encoding using second order non-linear gradients. The radial phase encoding technique can also be applied to one-dimensional slice selection achieved by a selective RF pulse and a linear gradient. Here the selective RF pulse may be the excitation RF pulse (i.e., the 90° pulse) or the selective spin-echo RF pulse (i.e., the 180° pulse) or both.

Figure 12:
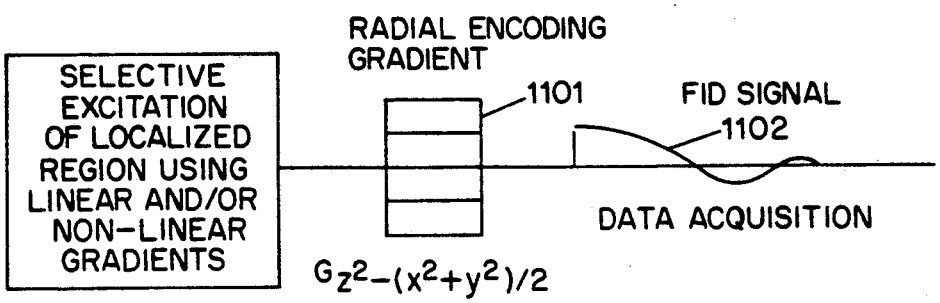
FIG. 12 schematically illustrates radial phase encoding of FID data in accordance with the invention by applying a stepped non-linear magnetic field gradient after any form of selective excitation of a localized region.

Turning now to FIG. 12, there is shown a diagram of a generalized FID acquisition sequence in which a stepped non-linear magnetic field gradient 1101 is applied after selective excitation of a localized region of a sample body by any technique to produce a radial phase encoded FID signal 1102.

Figure 13:
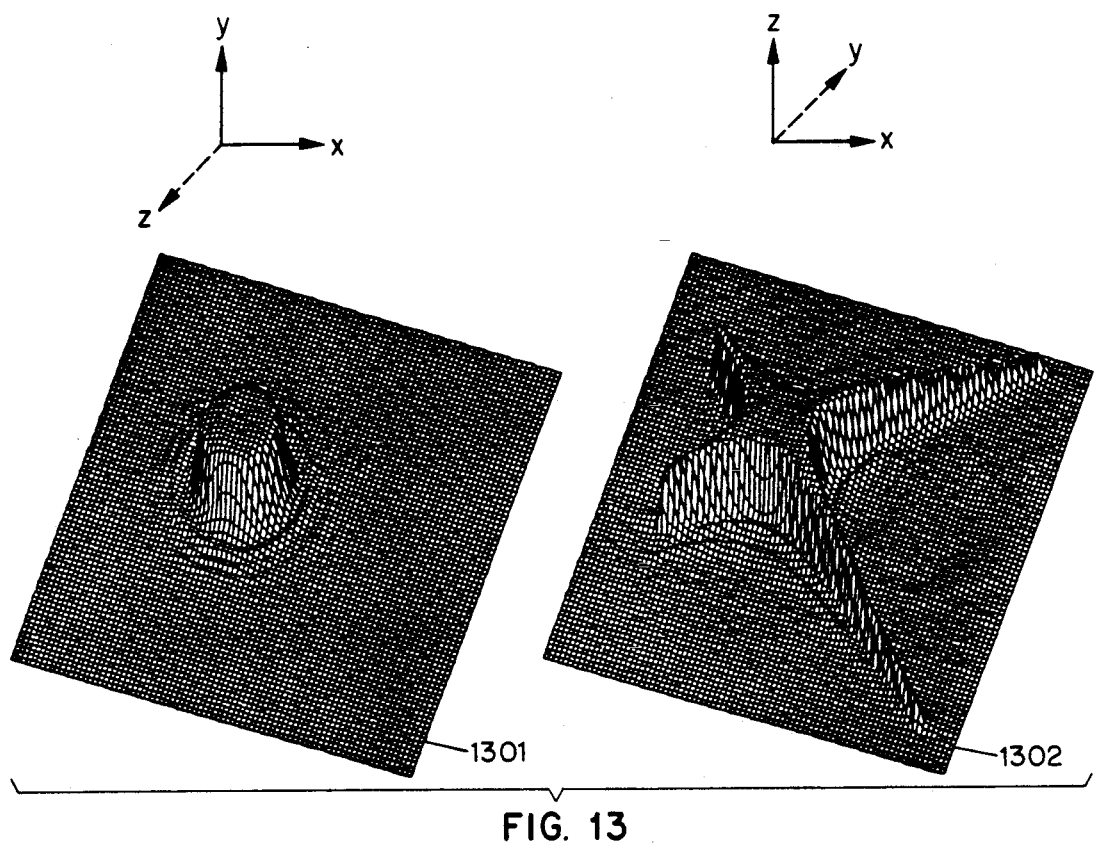
FIG. 13 shows perspective views of axial and coronal images of a water phantom obtained with the high-order magnetic field gradient selection process in accordance with the invention.

Referring to FIG. 13, there are shown in perspective view two selected images of selected regions of a long cylindrical water phantom (sample body) positioned parallel to the z-axis. The images were obtained using the RF pulse and magnetic field gradient sequence shown in FIG. 5 with the addition of a linear magnetic field gradient and a frequency offset in the RF pulse for moving the selected volume in the x-direction. The image 1301 shows an axial image in perspective view, and the image 1302 shows a coronal image in perspective view. As may be seen from FIG. 13, clean and well defined regions are selected with non-linear magnetic field gradients in accordance with the invention without any noticeable selection artifacts.

Eddy Current Shielding for Second Order Magnetic Field Gradients

The pulsing of magnetic field gradients tends to induce eddy currents in the conductive portions of the system, especially in the main magnet. Such eddy currents can cause undesirable distortions in magnetic resonance spectroscopy or magnetic resonance imaging. Accordingly, it is generally necessary to suppress the eddy currents induced by pulse magnetic field gradients in a NMR data acquisition and processing system. Such suppression is preferably accomplished by using active shielding. Active shielding of induced eddy currents from pulsed linear magnetic field gradients is known and is described in P. Mansfield et al., "Active Magnetic Screening of Gradient Coils in NMR Imaging", J. Mag. Res., Vol. 66, pp. 573, 1986.

In the system of FIGS. 2 and 3, a $z^2$ gradient coil having active eddy current shielding is used. The design of that coil is now described.

Figure 14:
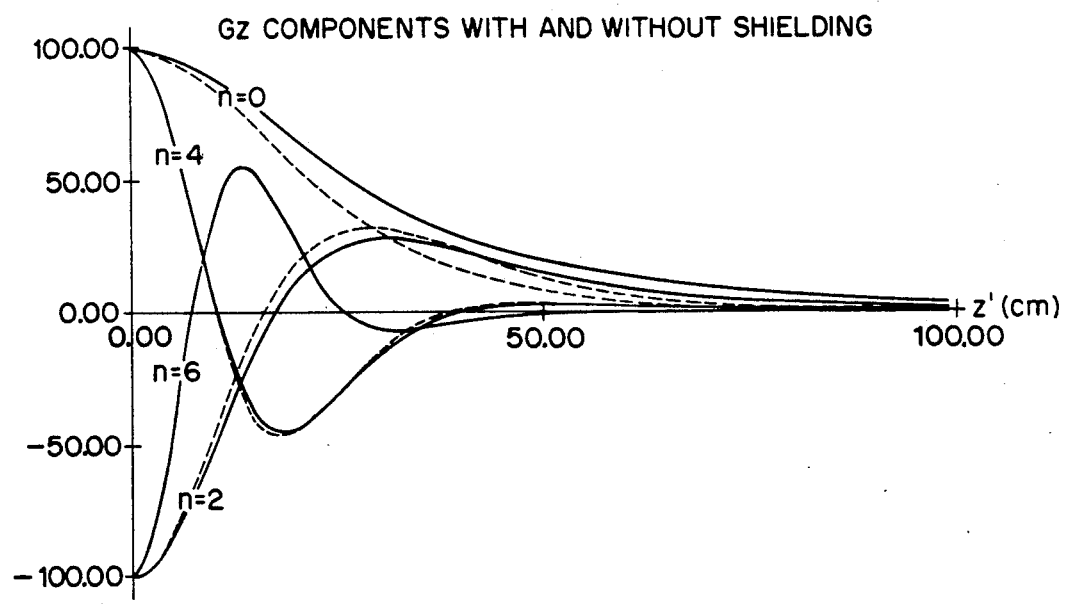
FIG. 14 is a graph showing the magnetic field gradient intensity versus distance for the 0th, 2nd, 4th and 6th order gradient components with and without active shielding in accordance with the invention.

The magnetic field intensity along the z axis from one loop current can be expressed as $$B_z(Z;a,I,z') = (\mu_0 I/2)[a^2/\{a^2+(z-z')^2\}^{3/2}], \quad (10)$$

where $\mu_0$, I, a, z' and z are the permeability of free space, the current in the loop, the radius and axial position of the loop, and the axial position where the field is being measured, respectively. Equation (1) can be extended by including the continuous shield of one primary loop coil for a given shield radius, a' as $$B'_z(z;a,I,z') = B_z(z;a,I,z') + \int B_z(z;a',I'(z''-z'),z'')dz'', \quad (11)$$

where $I'(z''-z')$ is the shield current density as a function of the position relative to a single-loop primary current and $z''$ is the shield current position. The time derivative of Eq. (10) at $z=0$, $[\partial^n B_z(z)/\partial z^n]_{z=0}$, is calculated analytically. The shield current density $I'(z''-z')$ is calculated numerically for a one-loop primary coil so that the magnetic field from the combination of the one-loop primary coil and the current distribution $I'(z''-z')$ is minimized on the inner conductive surface of the magnet. Eq. (11) is used to generate z' vs $[\partial^n B'_z(z)/\partial z^n]_{z=0}$ tables, where both the one-loop primary coil and the corresponding shield current density are considered. A graph showing the intensities of the 0th, 2nd, 4th and 6th order gradients as a function of z' with and without shielding is shown in FIG. 14. The gradients in FIG. 14 are obtained by taking the corresponding order derivatives of $B_z$ and $B'_z$, respectively, for $a = 35$ cm and $a' = 48$ cm.

The $z^n$ gradient coil can be designed by cancelling out all the low order components and one high order component with the same symmetry (even or odd). It should be noted that the contribution of a one-loop coil to a specific component at $z=0$ can have a different polarity depending on the coil position. Therefore, the polarity of the current should be chosen carefully as a function of the position when maximizing or cancelling out a specific component. Gradient components for the various orders are calculated by integrating the area under the curve representing each gradient component weighted by the current distribution of the primary coil.

Figure 15:
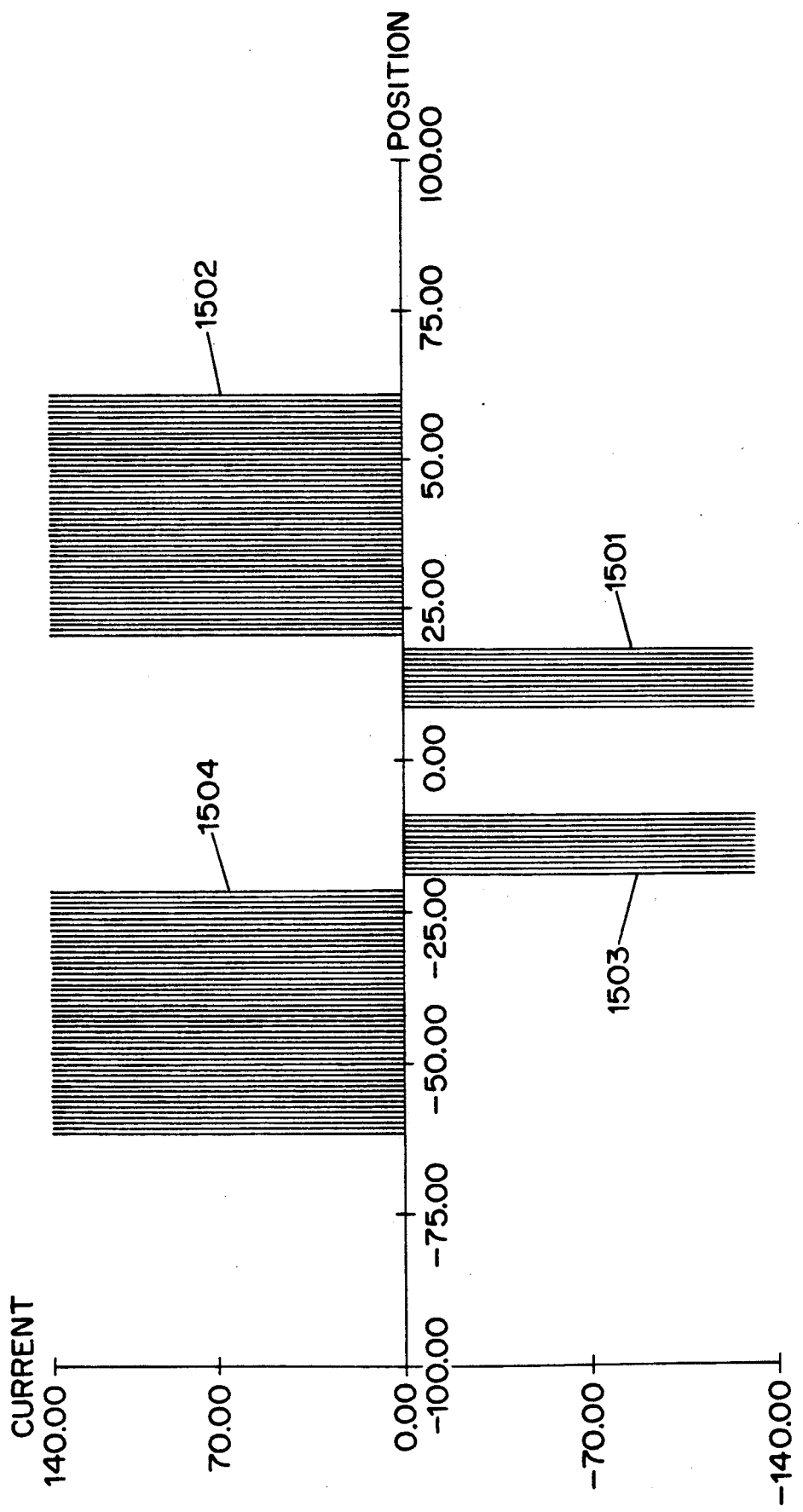
FIG. 15 is a diagram of the structure of the primary windings of the coils which generate the $z^2$ magnetic field gradient in the system of FIG. 2 and the currents through the windings.

A graph of the positions of the primary winding of the coils for generating a $z^2$ gradient versus current through the windings is shown in FIG. 15. The $z^2$ gradient coil represented by FIG. 15 can be viewed as consisting of two pairs of spaced apart primary windings 1501 and 1502, and 1503 and 1504, respectively, which are symmetrically positioned on each side of the $z=0$ position with the windings in each pair carrying current in opposite directions. The smaller windings 1501 and 1503 each contain 12 turns, and the larger windings 1502 and 1504 each contain 46 turns.

Figure 16:
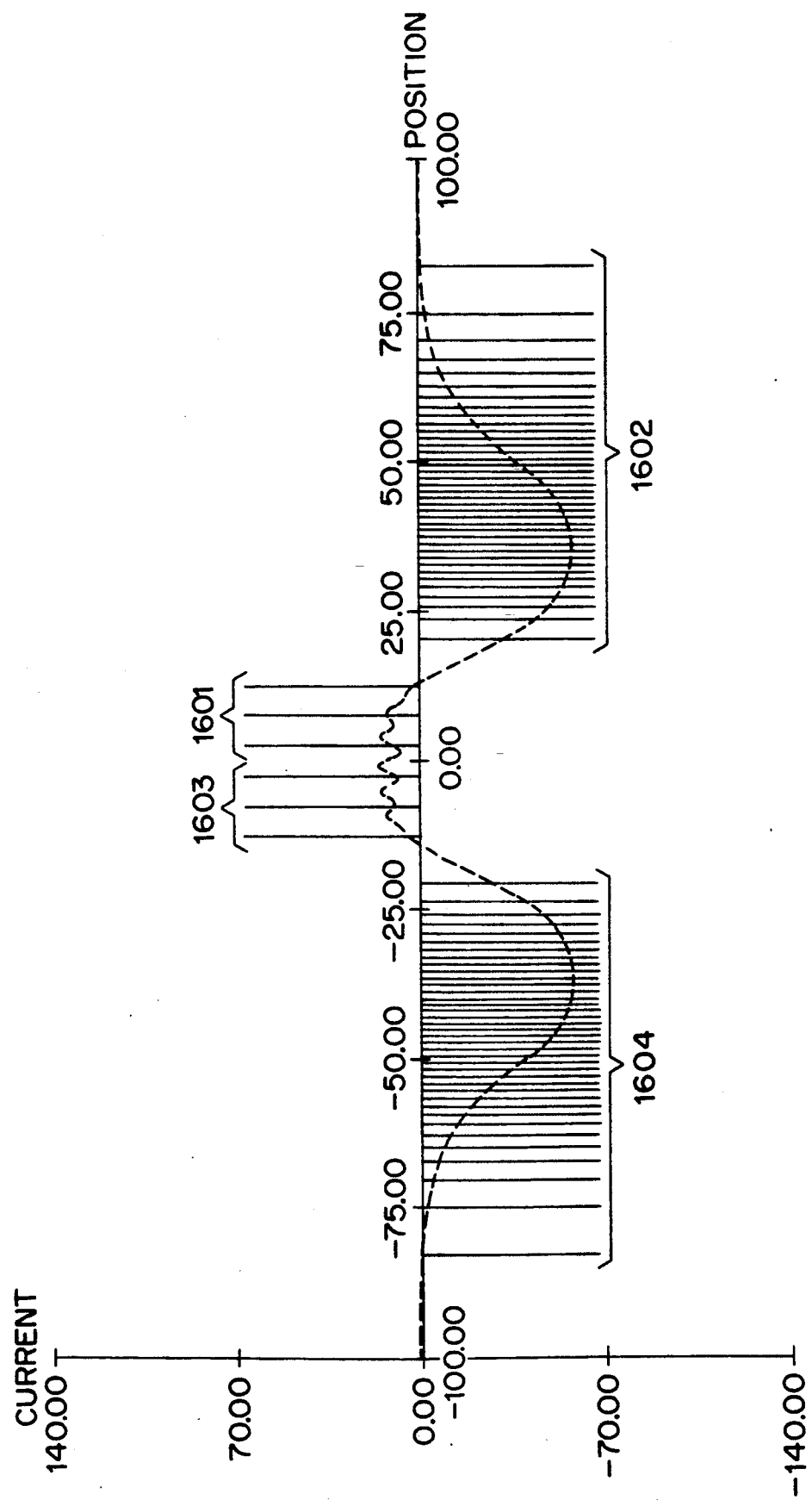
FIG. 16 is a diagram illustrating the shield winding structure of the coils of FIG. 15.

Turning now to FIG. 16, there is shown a graph of the positions of the shield windings versus the current through the shield windings for the $z^2$ gradient coil of FIG. 15. The shield windings can also be viewed as consisting of two pairs of spaced apart windings 1601 and 1602, and 1603 and 1604 symmetrically positioned on each side of the $z=0$ position with the windings in each pair carrying current in opposite directions. The shield windings represented by the graph of FIG. 16 provide eddy current suppression optimized for the magnet surface at $r=55$ cm. From the continuous shield current distribution represented by the dotted in FIG. 16, discrete coil positions for a given current intensity are calculated and adjusted as half of the primary current. The error from the truncation at each end and the approximation using discrete current is minimized by the iterative optimization of the coil positions.

Data Processing

Fourier transform analysis may be used for the reconstruction of a magnetic resonance image or to carry out spatially resolved magnetic resonance spectroscopy from the NMR data obtained using linear gradient spatial encoding. More specifically, a two-dimensional image can be reconstructed from spin-echo data obtained by using a Fourier imaging sequence in the following manner: The two-dimensional spin-echo data, $s(\omega_x, \omega_y)$, can be expressed as $$S(\omega_x, \omega_y) = \int_{-\infty}^{+\infty} \int_{-\infty}^{+\infty} f(x,y) e^{j(\omega_x x + \omega_y y)} dxdy, \quad (12)$$

where $j=\sqrt{-1}$, $\omega_x = \gamma G_x t_x$, and $\omega_y = \gamma G_y t_y$. In Eq. (12) $f(x,y)$ is the spin distribution function for the x-y plane, $\gamma$ is the gyromagnetic ratio, $G_x$ and $G_y$ are respectively the linear gradient intensities along the x and y directions, and $t_x$ and $t_y$ are respectively the gradient lengths along the x and y directions. The data scanning in the $\omega_x$-$\omega_y$ plane is achieved either by multiple data acquisition with different gradient intensities or by sampling the data during a constant gradient. From Eq. (12) $f(x,y)$ can be reconstructed by a two-dimensional Fourier transformation of $s(\omega_x, \omega_y)$. This same analysis applies to spatially localized two-dimensional magnetic resonance imaging with a spatial selection using a high-order gradient. In spatially localized magnetic resonance spectroscopy, Fourier transform analysis is also used to resolve the frequency components. Equation (12) can be extended to other multi-dimensional magnetic resonance imaging or spatially resolved magnetic resonance spectroscopy or chemical shift imaging by using a corresponding multi-dimensional Fourier transform analysis.

The radial reconstruction of NMR data obtained using radial phase encoding can be accomplished in the following manner. It is assumed that the NMR data is acquired with one encoding gradient in the radial direction for radially resolved magnetic resonance spectroscopy and that an ideally thin slice is selected. Furthermore, it is assumed that the radial field gradient linearly proportional to $r^2$, $G_{r2}$ is used. The signal obtained for different intensities of $G_{r2}$ can be written as $$S(G_{r2}) = \int_{-\infty}^{+\infty} \int_{-\infty}^{+\infty} f(x,y) e^{j\gamma G_{r2} t_r 2(x^2+y^2)} dxdy, \quad (13)$$

where $t_r$ is the length of the radial gradient. By substituting $x = r\cos\theta$, and $y = r\sin\theta$, Eq. (13) becomes $$S(G_{r2}) = \int_{0}^{2\pi} \int_{0}^{+\infty} f_{r,\theta}(r,\theta) e^{j\gamma G_{r2} t_r 2(r^2)} r \, dr \, d\theta \quad (14)$$

or $$S(G_{r2}) = (1/2) \int_{0}^{+\infty} f_R(R) e^{j\gamma G_{r2} t_r 2R} dR, \quad (15)$$

where $f_{r,\theta}(r,\theta) = f(r\cos\theta, r\sin\theta)$, $R = r^2 = x^2 + y^2$ and $$f_R(R) = \left[ \int_{0}^{2\pi} f_{r,\theta}(r,\theta) d\theta \right]_{r=\sqrt{R}}. \quad (16)$$

By performing a one dimensional Fourier transformation of Eq. (15) in the $G_r$ direction, $f_R(R)$ can be obtained. This is the spectra for a ring-shaped volume of radius r. Furthermore, by integrating $f_R(R)$ over the limits $0 \leq R \leq a^2$, the integrated value of $f(x,y)$ in the circle of radius a can be obtained. This is the spectra for a disc-shaped volume of radius a. The reconstruction of radially encoded images can be performed in the same manner. After the reconstruction of an image for each radial decoding, a Fourier transformation is performed in the $G_{r2}$ direction for radial encoding.

Consideration of Slice Thickness

Since the $z^2 - (x^2 + y^2)/2$ gradient has z-directional field variation, the thickness and position of a selected slice should be carefully chosen depending on the radius of the selected circular area taking into account possible error in the radius. The locus of equal $B_z$ of the $z^2 - (x^2 + y^2)/2$ gradient follows the surface of the plane defined by $$r^2 - 2z^2 = \rho^2, \quad (17)$$

where $\rho$ is the radius of the circle in the $z=0$ plane. For a given $\rho$, r increases as z increases. The radius variation for a selected volume can be calculated depending upon the slice thickness in the following manner. From Eq. (17) the radius of a selected volume, r, can be expressed as a function of z by the relation $$r(z;\rho) = \sqrt{(\rho^2 + 2z^2)}. \quad (18)$$

The distortion factor, $f_D$, representing the relative change of the radius of the circle depending upon the slice thickness ($z = k\rho$), can be written as $$f_D = r(z;\rho)/r(0;\rho) = \sqrt{(1 + 2k^2)}. \quad (19)$$

Table 1 shows the values of $f_D$ for several values of k. As would be expected, there is less selection diameter variation with a thinner slice selection. For a reasonably small change in the radius of 10% or 20%, the slice thickness should be less than 30% or 50%, respectively, of the selection diameter at $z=0$.

TABLE I

Slice thickness vs. Distortion factors. Here, k = (slice thickness)/(selection diameter at z = 0) and $f_D$ = (maximum selection diameter variation relative to the selection diameter at z = 0).

| k | 0.2 | 0.3 | 0.4 | 0.5 | 0.6 | 0.7 | 0.8 |
|---|---|---|---|---|---|---|---|
| $f_D$ | 1.04 | 1.09 | 1.15 | 1.23 | 1.31 | 1.41 | 1.51 |

While the invention has been illustrated and described in terms of specific exemplary embodiments, it will be understood that various modifications and alterations to such embodiments may be made by those skilled in the relevant arts without departing from the spirit of the invention or its scope as defined by the appended claims.

We claim:

1. A method for spatially localizing nuclear magnetic resonance (NMR) signals from a sample body comprising the steps of:
   applying a homogeneous static magnetic field to the sample body along a z direction of mutually orthogonal x, y and z directions;
   concurrently applying to the sample body a frequency-selective radio frequency (RF) excitation pulse and a non-linear magnetic field gradient;
   concurrently applying to the sample body a frequency-selective spin-echo RF pulse and a linear selection magnetic field gradient; and
   sampling magnetic resonance signals from a localized volume in the sample body defined by the concurrent application of the excitation RF pulse and the non-linear magnetic field gradient, and the concurrent application of the spin-echo RF pulse and the linear selection magnetic field gradient.

2. A method for spatially localizing NMR signals from a sample body comprising the steps of:
   applying a homogeneous static magnetic field to the sample body along a z direction of mutually orthogonal x, y and z directions;
   concurrently applying to the sample body a frequency-selective radio frequency (RF) excitation pulse and a linear selection magnetic field gradient;
   concurrently applying to the sample body a frequency-selective spin-echo RF pulse and a non-linear magnetic field gradient; and
   sampling magnetic resonance signals from a localized volume in the sample body defined by the concurrent application of the excitation RF pulse and the linear selection magnetic field gradient, and the concurrent application of the spin-echo RF pulse and the non-linear selection magnetic field gradient.

3. A method for spatially localizing NMR signals according to claim 1, wherein the frequency-selective RF excitation pulse has a frequency spectrum and pulse duration for causing a 90° rotation of spins within the localized volume, and the frequency-selective spin-echo RF pulse has a frequency spectrum and pulse duration for causing a 180° rotation of spins within the localized volume.

4. A method for spatially localizing NMR signals according to claim 1, wherein the non-linear magnetic field gradient concurrently applied with the excitation pulse has a functional form of $x^2+y^2-2z^2$.

5. A method for spatially localizing NMR signals according to claim 1, wherein the non-linear magnetic field gradient applied concurrently with the excitation RF pulse comprises a linear combination of one or more second-order magnetic field gradient components having respective functional forms of $x^2+y^2-2z^2$, $x^2-y^2$, $xy$, $yz$, and $zx$.

6. A method for spatially localizing NMR signals according to claim 5, wherein the non-linear magnetic field gradient applied concurrently with the excitation RF pulse further comprises a linear combination of one or more lower order magnetic field gradient components having respective functional forms of $x$, $y$, $z$ and $z^0$.

7. A method for spatially localizing NMR signals according to claim 1, wherein the linear selection magnetic field gradient is in the z direction.

8. A method for spatially localizing NMR signals according to claim 1, wherein the linear selection magnetic field gradient comprises a linear combination of one or more linear magnetic field gradient components in the x, y and z directions, respectively.

9. A method for spatially localizing NMR signals according to claim 1, wherein after the application of the excitation RF pulse there is applied a rephasing magnetic field gradient having the same functional form as the non-linear magnetic field gradient but being of opposite polarity, the rephasing magnetic field gradient having an intensity and duration sufficient to refocus spins which are dephased during the application of the excitation RF pulse.

10. A method for spatially localizing NMR signals according to claim 1, wherein after the concurrent application of the spin-echo RF pulse and the linear selection magnetic field gradient there is applied a rephasing magnetic field gradient having the same functional form and polarity as the non-linear magnetic field gradient applied concurrently with the excitation RF pulse, and having an intensity and duration sufficient to refocus spins which are dephased during the application of the excitation RF pulse.

11. A method for spatially localizing NMR signals according to claim 1, further comprising the steps of applying a first phase encoding magnetic field gradient pulse in one of the x and y directions and a dephasing magnetic field gradient pulse in the other of the x and y directions before the sampling of the magnetic resonance signals from the localized volume in the sample body; applying a linear read magnetic field gradient in the other of the x and y directions during the sampling of the magnetic resonance signals from the localized volume in the sample body; successively repeating the application of the first phase encoding magnetic field gradient and the dephasing magnetic field gradient while varying the intensity of the first phase encoding magnetic field qradient by a predetermined step before the sampling of the magnetic resonance signals in each repetition, and the application of the read magnetic field gradient during the sampling of the magnetic resonance signals in each repetition.

12. A method for spatially localizing NMR signals according to claim 11, further comprising the steps of applying a second phase encoding magnetic field gradient in the z direction before the sampling of the magnetic resonance signals from the localized volume in the sample body; and successively repeating the application of the second phase encoding magnetic field gradient while varying the intensity thereof by a predetermined step before the sampling of the magnetic resonance signals from the localized volume in the sample body in each repetition.

13. A method for spatially localizing NMR signals according to claim 1, further comprising the steps of applying one or more phase encoding magnetic field gradients in the x, y and z directions, respectively, before the sampling of the magnetic resonance signals from the localized volume in the sample body; and successively repeating the application of the one or more phase encoding magnetic field gradients while varying the intensity of each of the one or more phase encoding magnetic field gradients by a respective predetermined step before the sampling of the magnetic resonance signals from the localized volume in the sample body in each repetition.

14. A method for spatially localizing NMR signals according to claim 11, further comprising the steps of applying a non-linear radial encoding magnetic field gradient before the sampling of the magnetic resonance signals from the localized volume in the sample body, the non-linear radial encoding magnetic field gradient having a functional form of $x^2+y^2-2z^2$; and successively repeating the application of the radial encoding magnetic field while varying the intensity thereof by a predetermined step before the sampling of the magnetic resonance signals from the localized volume in the sample body in each repetition.

15. A method for spatially localizing NMR signals according to claim 13, further comprising the steps of applying a non-linear radial encoding magnetic field gradient before the sampling of the magnetic resonance signals from the localized volume in the sample body, the non-linear radial encoding magnetic field gradient having a functional form of $x^2+y^2-2z^2$; and successively repeating the application of the radial encoding magnetic field while varying the intensity thereof by a predetermined step before the sampling of the magnetic resonance signals from the localized volume in the sample body in each repetition.

16. A method for spatially localizing NMR signals from a sample body comprising the steps of:
applying a homogeneous static magnetic field to the sample body along a z direction of mutually orthogonal x, y and z directions;
selectively exciting a localizing volume in the sample body by applying one or more excitation RF pulses concurrently with corresponding magnetic field gradient pulses;
radially encoding the selectively excited localized volume in the sample body by applying a radial encoding non-linear magnetic field gradient having a functional form of $x^2+y^2-2z^2$;
sampling free induction decay (FID) signals from the selectively excited and radially encoded localized volume in the sample material; and
successively repeating the radial encoding of the selectively excited localized volume in the sample material by applying the radial encoding magnetic field gradient with the intensity thereof changed by a predetermined step before the sampling of the FID signals from the localized volume of the sample body in each repetition.

17. A method for spatially localizing NMR signals from a sample body comprising the steps of:
applying a homogeneous static magnetic field to the sample body along the z direction of mutually orthogonal x, y and z directions; and
concurrently applying to the sample body a frequency-selective excitation RF pulse, an oscillatory second order non-linear magnetic field gradient, and an oscillatory linear magnetic field gradient, the respective waveforms of the excitation RF pulse, the oscillatory non-linear magnetic field gradient and the oscillatory linear magnetic field gradient being selected to provide selective excitation of a localized volume in the sample body; and
sampling FID signals from the selectively excited localized volume in the sample body.

18. A method for spatially localizing NMR signals according to claim 17, further comprising the steps of:
phase encoding the selectively excited localized volume in the sample body by applying one or more phase encoding linear magnetic field gradients in the x, y and z directions, respectively, before the sampling of the FID signals from the selectively excited localized volume in the sample body; and
successively repeating the phase encoding of the selectively excited localized volume in the sample body by applying the one or more phase encoding magnetic field gradients with the intensity of each of the phase encoding gradients changed by a respective predetermined step after the current application of the excitation RF pulse, the oscillatory non-linear magnetic field gradient and the oscillatory linear magnetic field gradient in each repetition.

19. A method for spatially localizing NMR signals in a sample body comprising the steps of:
applying a homogeneous static magnetic field to the sample body along the z direction of mutually orthogonal x, y and z directions;
concurrently applying to the sample body a frequency-selective excitation RF pulse, an oscillatory second order non-linear magnetic field gradient, and an oscillatory linear magnetic field gradient, the respective waveforms of the excitation RF pulse, the oscillatory non-linear magnetic field gradient and the oscillatory linear magnetic field gradient being selected to provide selective excitation of a localized volume in the sample body; and
sampling FID signals from the selectively excited localized volume in the sample body;
successively repeating the concurrent application to the sample body of the frequency-selective excitation RF pulse, the oscillatory second order non-linear magnetic field gradient, and the oscillatory linear magnetic field gradient while changing the respective waveforms of the excitation RF pulse, the oscillatory non-linear magnetic field gradient and the oscillatory linear magnetic field gradient in each repetition to provide selective excitation of a modified localized volume in the sample body in each repetition; and
analyzing the sampled FID signals after the successive repetition of the concurrent application of the excitation RF pulse, the oscillatory non-linear magnetic field gradient and the oscillatory linear magnetic field gradient to obtain NMR data for a fully resolved volume in the sample body.

20. A method for spatially localizing NMR signals in a sample body comprising the steps of:
applying a homogeneous static magnetic field to the sample body along the z direction of mutually orthogonal x, y and z directions;
concurrently applying to the sample body a frequency-selective excitation RF pulse, an oscillatory second order non-linear magnetic field gradient, and an oscillatory linear magnetic field gradient, the respective waveforms of the excitation RF pulse, the oscillatory non-linear magnetic field gradient and the oscillatory linear magnetic field gradient being selected to provide selective excitation of a localized volume in the sample body;
phase encoding the selectively excited localized volume in the sample body by applying one or more phase encoding linear magnetic field gradients in the x, y and z directions, respectively;
sampling FID signals from the selectively excited localized volume in the sample body;
successively repeating the phase encoding of the selectively excited localized volume in the sample body by applying the one or more phase encoding magnetic field gradients with the intensity of each of the phase encoding gradients changed by a predetermined step after the concurrent application of the excitation RF pulse, the oscillatory non-linear magnetic field gradient and the oscillatory linear magnetic field gradient in each repetition;

successively changing the respective waveforms of the excitation RF pulse, the oscillatory non-linear magnetic field gradient and the oscillatory linear magnetic field gradient to provide selective excitation of a modified localized volume in the sample body after each successive repetition of the phase encoding of the selectively excited localized volume in the sample body; and analyzing the sampled FID signals after the successive changing of the respective waveforms of the excitation RF pulse, the oscillatory non-linear magnetic field gradient and the oscillatory linear magnetic field gradient to obtain NMR data for a fully resolved volume in the sample body.

21. A method for spatially localizing NMR signals in a sample body comprising the steps of:

applying a homogeneous static magnetic field to the sample body along the z direction of mutually orthogonal x, y and z directions;

concurrently applying to the sample body a frequency-selective excitation RF pulse, a second order non-linear magnetic field gradient and a linear magnetic field gradient, the waveform of the excitation RF pulse and the respective intensities of the non-linear magnetic field gradient and the linear magnetic field gradient being selected to provide selective excitation of a localized volume in the sample body;

sampling FID signals from the selectively excited localized volume in the sample body;

successively repeating the concurrent application to the sample body of the frequency-selective excitation RF pulse, the non-linear magnetic field gradient and the linear magnetic field gradient with the intensity of the non-linear magnetic field gradient and the intensity of the linear magnetic field gradient changed by respective preselected non-uniform steps to provide selective excitation of a modified localized volume in the sample body; and processing the sampled FID signals after the successive repetition of the concurrent application of the excitation RF pulse, the non-linear magnetic field gradient and the linear magnetic field gradient to obtain NMR data for a fully resolved localized volume in the sample body.

22. A method for spatially localizing NMR signals in a sample body comprising the steps of:

applying a homogeneous static magnetic field to the sample body along the z direction of mutually orthogonal x, y and z directions;

concurrently applying to the sample body a frequency-selective excitation RF pulse, a second order non-linear magnetic field gradient and a linear magnetic field gradient, the waveform of the excitation RF pulse and the respective intensities of the non-linear magnetic field gradient and the linear magnetic field gradient being selected to provide selective excitation of a localized volume in the sample body;

phase encoding the selectively excited localized volume in the sample body by applying one or more phase encoding linear magnetic field gradients in the x, y and z directions, respectively;

sampling FID signals from the selectively excited localized volume in the sample body;

successively repeating the phase encoding of the selectively excited localized volume in the sample body by applying the one or more phase encoding magnetic field gradients with the intensity of each of the phase encoding gradients changed by a respective predetermined step after the concurrent application of the excitation RF pulse, the non-linear magnetic field gradient and the linear magnetic field gradient in each repetition;

successively changing the intensity of the non-linear magnetic field gradient and the intensity of the linear magnetic field gradient by respective preselected non-uniform steps to provide selective excitation of a modified localized volume in the sample body after each successive repetition of the phase encoding of the selectively excited localized volume of the sample body; and processing the sampled FID signals after the successive changing of the respective intensities of the non-linear magnetic field gradient and the linear magnetic field gradient to obtain NMR data for a fully resolved localized volume in the sample body.

23. Apparatus for obtaining and analyzing NMR data from a sample body comprising:

means for operatively applying a homogeneous static magnetic field to the sample body along a z direction of mutually orthogonal x, y and z directions;

RF pulse means for operatively generating an RF pulse of selectable frequency spectrum and pulse duration;

RF field means for applying the RF pulse generated by the RF pulse means to the sample body;

magnetic field gradient means for operatively applying magnetic field gradients to the sample body;

detection means for operatively detecting NMR signals from the sample body; and processing means for controlling the RF pulse means, the magnetic field gradient means and the detection means, and for analyzing the NMR signals detected by the detection means, the RF pulse means being responsive to the processing means for generating a frequency-selective excitation RF pulse applied to the sample body by the RF field means, the excitation RF pulse having a frequency spectrum and pulse duration for causing a 90° rotation of spins within a preselected localized volume of the sample material, the magnetic field gradient means being responsive to the processing means for applying a predetermined non-linear magnetic field gradient to the sample body concurrently with the application of the excitation RF pulse by the RF field means, the RF pulse means being further responsive to the processing means for generating a spin-echo RF pulse applied to the sample body by the RF field means, the spin-echo RF pulse having a frequency spectrum and pulse duration for causing a 180° rotation of the spins in the preselected localized volume, and the magnetic field gradient means being further responsive to the processing means for applying a predetermined linear selection magnetic field gradient to the sample body concurrently with the application of the spin-echo RF pulse by the RF field means.

24. Apparatus for obtaining and analyzing NMR data according to claim 23, wherein the predetermined non-linear magnetic field gradient applied to the sample body by the magnetic field gradient means concurrently with the application of the excitation RF pulse by the RF field means has a functional form of $x^2+y^2-2z^2$.

25. Apparatus for obtaining and analyzing NMR data according to claim 23, wherein the predetermined non-linear magnetic field gradient applied to the sample body concurrently with the application of the excitation RF pulse by the RF field means comprises a linear combination of one or more second order magnetic field gradient components having respective functional forms of $x^2+y^2-2z^2$, $x^2-y^2$, xy, yz and zx.

26. Apparatus for obtaining and analyzing NMR data according to claim 25, wherein the predetermined non-linear magnetic field gradient applied to the sample body concurrently with the application of the excitation RF pulse by the RF field means further comprises a linear combination of one or more lower-order magnetic field gradient components having respective functional forms of x, y, z and $z^0$.

27. Apparatus for obtaining and analyzing NMR data according to claim 23, wherein the magnetic field gradient means includes first coil means for applying a second-order non-linear magnetic field gradient to the sample body and second coil means for applying linear magnetic field gradients to the sample body, the first coil means comprising two pairs of spaced-apart primary layer windings each having an axis along the z direction and being symmetrically positioned on each side of a z=0 position, the respective primary layer windings in each pair being adapted to carry current in opposite directions, the coil means further comprising two pairs of spaced-apart secondary layer windings coaxial with the primary layer windings and being symmetrically positioned on each side of the z=0 position, the respective secondary layer windings in each pair being adapted to carry current in opposite directions and for reducing the eddy currents induced by pulsing of the non-linear magnetic field gradient applied by the first coil means.

28. Apparatus for obtaining and analyzing NMR data according to claim 23, wherein the magnetic field gradient means is further responsive to the processing means for applying a first phase encoding magnetic field gradient in one of the x and y directions and a dephasing magnetic field gradient pulse in the other of the x and y directions before detection of the NMR signals by the detection means, and for applying a read linear magnetic field gradient pulse in the other of the x and y directions during detection of the NMR signals by the detection means, the application of the excitation RF pulse, the non-linear magnetic field gradient pulse, the first phase encoding magnetic field gradient pulse, the dephasing magnetic field gradient pulse, the spin-echo RF pulse, the selection magnetic field gradient pulse and the read magnetic field gradient pulse being successively repeated, the intensity of the first phase encoding magnetic field gradient being changed by a predetermined step in each repetition, and the processing means being adapted to derive a magnetic resonance image of the preselected localized volume in the sample body by analyzing the NMR signals detected by the detection means.

29. Apparatus for obtaining and analyzing NMR data according to claim 28, wherein the magnetic field gradient means is further responsive to the processing means for applying a second phase encoding linear magnetic field gradient in the z direction before detection of the NMR signals by the detection means, the second phase encoding magnetic field gradient being repeated with the first phase encoding magnetic field gradient, the intensity of the second phase encoding magnetic field gradient being changed by a predetermined step in each repetition, and the processing means being adapted to derive a three dimensional magnetic resonance image of the preselected localized volume in the sample body by analyzing the NMR signals detected by the detection means.

30. Apparatus for obtaining and analyzing NMR data according to claim 28, wherein the magnetic field gradient means is further responsive to the processing means for applying a non-linear radial encoding magnetic field gradient having a functional form of $x^2+y^2-2z^2$ before the detection of the NMR signals by the detection means, the radial encoding magnetic field gradient being repeated with the first phase encoding magnetic field gradient, the intensity of the radial encoding magnetic field gradient being changed by a predetermined step in each repetition.

31. Apparatus for obtaining and analyzing NMR data according to claim 23, wherein the magnetic field gradient means is further responsive to the processing means for applying one or more phase encoding linear magnetic field gradients in the x, y and z directions, respectively, before detection of NMR signals by the detection means, the application of the excitation RF pulse, the non-linear magnetic field gradient, the spin-echo RF pulse, the selection magnetic field gradient and the one or more phase encoding magnetic field gradients being successively repeated with the intensity of each one of the one or more phase encoding magnetic field gradients being changed by a predetermined step in each repetition, and the processing means being adapted to derive a chemical shift image of the preselected localized volume in the sample body by analyzing the NMR signals detected by the detection means.

32. Apparatus for obtaining and analyzing NMR data according to claim 31, wherein the magnetic field gradient means is further responsive to the processing means for applying a non-linear radial encoding magnetic field gradient having a functional form of $x^2+y^2-2z^2$ before the detection of the NMR signals by the detection means, the radial encoding magnetic field gradient being repeated with one or more phase encoding magnetic field gradients, the intensity of the radial encoding magnetic field gradient being changed by a predetermined step in each repetition.

33. Apparatus for obtaining and analyzing NMR data in a localized volume of a sample body comprising:
   means for operatively applying a homogeneous static magnetic field to the sample body along a z direction of mutually orthogonal x, y and z directions;
   RF pulse means for operatively generating an RF pulse of selectable frequency spectrum and pulse duration;
   RF field means for applying the RF pulse generated by the RF pulse means to the sample body;
   magnetic field gradient means for operatively applying magnetic field gradients to the sample body;
   detection means for operatively detecting NMR signals from the sample body; and
   processing means for controlling the RF pulse means, the magnetic field gradient means and the detection means, and for analyzing the NMR signals detected by the detection means, the RF pulse means being responsive to the processing means for generating one or more excitation RF pulses and the magnetic field gradient means being responsive to the processing means for concurrently applying respective magnetic field gradients to selectively excite a localized volume in the sample body, the magnetic field gradient means being further responsive to the processing means for applying a radial encoding non-linear magnetic field gradient having a functional form of $x^2+y^2-2z^2$ after the selective excitation of the localized volume in the sample body, the selective excitation of the localized volume in the sample body and the application of the radial encoding magnetic field gradient being successively repeated, the intensity of the radial encoding magnetic field gradient being changed by a predetermined step in each repetition, and the processing means analyzing a FID signal detected by the detection means after each repetition.

34. Apparatus for obtaining and analyzing NMR data in a localized volume of a sample body comprising:
   means for operatively applying a homogeneous static magnetic field to the sample body along a z direction of mutually orthogonal x, y and z directions;
   RF pulse means for operatively generating an RF pulse of selectable frequency spectrum and pulse duration;
   RF field means for applying the RF pulse generated by the RF pulse means to the sample body;
   magnetic field gradient means for operatively applying magnetic field gradients to the sample body;
   detection means for operatively detecting NMR signals from the sample body; and
   processing means for controlling the RF pulse means, the magnetic field gradient means and the detection means, and for analyzing the NMR signals detected by the detection means, the RF pulse means being responsive to the processing means for generating a frequency-selective excitation RF pulse applied to the sample body by the RF field means, the magnetic field gradient means being responsive to the processing means for applying an oscillatory second order non-linear magnetic field gradient and an oscillatory linear magnetic field gradient in the z direction concurrently with the application of the excitation RF pulse, the respective waveforms of the excitation RF pulse, the oscillatory non-linear magnetic field gradient and the oscillatory linear magnetic field gradient in the z direction being selected to provide selective excitation of a localized volume in the sample body.

35. Apparatus for obtaining and analyzing NMR data according to claim 34, wherein the magnetic field gradient means is further responsive to the processing means for applying one or more phase encoding linear magnetic field gradients in the x, y and z directions, respectively, before detection of the NMR signals by the detection means, the application of the frequency-selective excitation RF pulse, the oscillatory non-linear magnetic field gradient, the oscillatory linear magnetic field gradient in the z direction and the one or more phase encoding linear magnetic field gradients being successively repeated, the intensity of each of the one or more phase encoding linear magnetic field gradients being changed by a respective predetermined step in each repetition, and the processing means is adapted to analyze the NMR signals detected by the detection means in each repetition.

36. Apparatus for obtaining and analyzing NMR data in a localized volume of a sample body comprising:
   means for operatively applying a homogeneous static magnetic field to the sample body along the z direction of mutually orthogonal x, y and z directions;
   RF pulse means for operatively generating an RF pulse of selectable frequency spectrum and pulse duration;
   magnetic field means for applying the RF pulse generated by the RF pulse means to the sample body;
   magnetic field gradient means for operatively applying magnetic field gradients to the sample body;
   detection means for operatively detecting NMR signals from the sample body; and
   processing means for controlling the RF pulse means, the magnetic field gradient means and the detection means, and for analyzing the NMR signals detected by the detection means, the RF pulse means being responsive to the processing means for generating a frequency-selective excitation RF pulse applied to the sample body by the RF field means, the magnetic field gradient means being responsive to the processing means for applying an oscillatory second order non-linear magnetic field gradient and an oscillatory linear magnetic field gradient in the z direction concurrently with the application of the excitation RF pulse, the respective waveforms of the excitation RF pulse, the oscillatory non-linear magnetic field gradient and the oscillatory linear magnetic field gradient being selected to provide selective excitation of a localized volume in the sample body, the RF pulse means and the magnetic field gradient means being further responsive to the processing means for successively repeating the concurrent application to the sample body of the frequency-selective excitation RF pulse, the oscillatory non-linear magnetic field gradient, and the oscillatory linear magnetic field gradient while changing the respective waveforms thereof in each repetition to provide selective excitation of a modified localized volume in the sample body, and the processing means being adapted to analyze the NMR signals detected by the detection means after the successive repetition of the concurrent application of the excitation RF pulse, the oscillatory non-linear magnetic field gradient and the oscillatory linear magnetic field gradient to obtain NMR data for a fully resolved volume in the sample body.

37. Apparatus for obtaining and analyzing NMR data in a localized volume of a sample body comprising:
   means for operatively applying a homogeneous static magnetic field to the sample body along the z direction of mutually orthogonal x, y and z directions;
   RF pulse means for operatively generating an RF pulse of selectable frequency spectrum and pulse duration;
   RF field means for applying the RF pulse generated by the RF pulse means to the sample body;
   magnetic field gradient means for operatively applying magnetic field gradients to the sample body;
   detection means for operatively detecting NMR signals from the sample body; and
   processing means for controlling the RF pulse means, the magnetic field gradient means and the detection means, and for analyzing the NMR signals detected by the detection means, the RF pulse means being responsive to the processing means for generating a frequency-selective excitation pulse applied to the sample body by the RF field means, the magnetic field gradient means being responsive to the processing means for applying an oscillatory second order non-linear magnetic field gradient and an oscillatory linear magnetic field gradient in the z direction concurrently with the application of the excitation RF pulse, the respective waveforms of the excitation RF pulse, the oscillatory non-linear magnetic field gradient and the oscillatory linear magnetic field gradient being selected to provide selective excitation of a localized volume of the sample body, the magnetic field gradient means being further responsive to the processing means for applying one or more phase encoding linear magnetic field gradients in the x, y and z directions, respectively, before detection of the NMR signals by the detection means, the application of the one or more phase encoding linear magnetic field gradients being successively repeated with the intensity of each of the phase encoding gradients being changed by a predetermined step in each repetition, the RF pulse means and the magnetic field gradient means being further responsive to the processing means for successively changing the respective waveforms of the excitation RF pulse, the oscillatory non-linear magnetic field gradient and the oscillatory linear magnetic field gradient to provide selective excitation of a modified localized volume in the sample body after each successive repetition of the application of the one or more phase encoding magnetic field gradients, and the processing means being adapted to analyze the NMR signals detected by the detection means after the successive changing of the respective waveforms of the excitation RF pulse, the oscillatory non-linear magnetic field gradient and the oscillatory linear magnetic field gradient to obtain NMR data for a fully resolved volume in the sample body.

38. Apparatus for obtaining and analyzing NMR data in a localized volume of a sample body comprising:

means for operatively applying a homogeneous static magnetic field to the sample body along the z direction of mutually orthogonal x, y and z directions;

RF pulse means for operatively generating an RF pulse of selectable frequency spectrum and pulse duration;

RF field means for applying the RF pulse generated by the RF pulse means to the sample body;

magnetic field gradient means for operatively applying magnetic field gradients to the sample body;

detection means for operatively detecting NMR signals from the sample body; and processing means for controlling the RF pulse means, the magnetic field gradient means and the detection means, and for analyzing the NMR signals detected by the detection means, the RF pulse means being responsive to the processing means for generating a frequency-selective excitation RF pulse applied to the sample body by the RF field means, the magnetic field gradient means being responsive to the processing means for applying a second order non-linear magnetic field gradient and a linear magnetic field gradient in the z direction concurrently with the application of the excitation RF pulse, the waveform of the excitation RF pulse and the respective intensities of the non-linear magnetic field gradient and the linear magnetic field gradient being selected to provide selective excitation of a localized volume in the sample body, the RF field means and the magnetic field grading means being further responsive to the processing means for successively repeating the concurrent application to the sample body of the frequency-selective excitation RF pulse, the non-linear magnetic field gradient and the linear magnetic field gradient with the intensity of the non-linear magnetic field gradient and the intensity of the linear magnetic field gradient being changed by respective preselected non-uniform steps to provide selective excitation of a modified localized volume in the sample body, and the processing means being adapted to analyze the NMR signals detected by the detection means after each successive repetition of the concurrent application of the excitation RF pulse, the non-linear magnetic field gradient and the linear field gradient to obtain NMR data for a fully resolved localized volume in the sample body.

39. Apparatus for obtaining and analyzing NMR data in a localized volume of a sample body comprising:

means for operatively applying a homogeneous static magnetic field to the sample body along the z direction of mutually orthogonal x, y and z directions;

RF pulse means for operatively generating an RF pulse of selectable frequency spectrum and pulse duration;

RF field means for applying the RF pulse generated by the RF pulse means to the sample body;

magnetic field gradient means for operatively applying magnetic field gradients to the sample body;

detection means for operatively detecting NMR signals from the sample body; and processing means for controlling the RF pulse means, the magnetic field gradient means and the detection means, and for analyzing the NMR signals detected by the detection means, the RF pulse means being responsive to the processing means for generating a frequency-selective excitation RF pulse applied to the sample body by the RF field means, the magnetic field gradient means being responsive to the processing means for applying a second order non-linear magnetic field gradient and an oscillatory linear magnetic field gradient in the z direction concurrently with the application of the excitation RF pulse, the waveform of the excitation RF pulse and the respective intensities of the non-linear magnetic field gradient and the linear magnetic field gradient being selected to provide selective excitation of a localized volume in the sample body; the magnetic field gradient means being further responsive to the processing means for applying one or more phase encoding linear magnetic field gradients in the x, y and z directions, respectively, before detection of the NMR signals by the detection means, the application of the one or more phase encoding linear magnetic field gradients being successively repeated with the intensity of each of the one or more phase encoding linear magnetic field gradients being changed by a respective predetermined step in each repetition, the RF pulse means and the magnetic field gradient means being still further responsive to the processing means for successively changing the intensity of the non-linear magnetic field gradient and the intensity of the linear magnetic field gradient by respective preselected non-uniform steps to provide selective excitation of a modified localized volume in the sample body after each successive repetition of the application of the one or more phase encoding linear magnetic field gradients, and the processing means being adapted to analyze the NMR signals detected by the detection means after each successive changing of the respective intensities of the non-linear magnetic field gradient and the linear magnetic field gradient to obtain NMR data for a fully resolved localized volume in the sample body.

* * * * *

UNITED STATES PATENT AND TRADEMARK OFFICE
CERTIFICATE OF CORRECTION

PATENT NO. : 5,122,748
DATED : June 16, 1992
INVENTOR(S) : Chang-Hyun Oh et al.

It is certified that error appears in the above-identified patent and that said Letters Patent is hereby corrected as shown below:

Col. 1, between lines 4 and 5, insert -- The U.S. Government has certain rights in this invention as provided for by the terms of Contract No. CA 28881 awarded by the National Institutes of Health. --. Col. 10, equation (6), that portion of line 56 reading "sinc" (second occurrence) should read -- ]sinc --. Col. 11, at the end of line 1, insert -- (7) --.

Signed and Sealed this

Tenth Day of August, 1993

Attest:

MICHAEL K. KIRK

Attesting Officer

Acting Commissioner of Patents and Trademarks